(12) United States Patent
Xiong et al.

(10) Patent No.: US 11,686,436 B2
(45) Date of Patent: Jun. 27, 2023

(54) LED FILAMENT AND LIGHT BULB USING LED FILAMENT

(71) Applicant: ZHEJIANG SUPER LIGHTING ELECTRIC APPLIANCE CO., LTD, Jinyun (CN)

(72) Inventors: Aiming Xiong, Jiaxing (CN); Lin Zhou, Jiaxing (CN); Mingbin Wang, Jiaxing (CN); Chenkun Chen, Hsinchu (TW); Chihshan Yu, Changhua (TW); Tao Jiang, Jiaxing (CN); Yuexing Li, Jiaxing (CN); Hayato Unagiike, Kai (JP); Yukihiro Saito, Kawasaki (JP); Zhichao Zhang, Jiaxing (CN)

(73) Assignee: ZHEJIANG SUPER LIGHTING ELECTRIC APPLIANCE CO., LTD

( * ) Notice: Subject to any disclaimer, the term of this patent is extended or adjusted under 35 U.S.C. 154(b) by 0 days.

(21) Appl. No.: 17/408,519

(22) Filed: Aug. 23, 2021

(65) Prior Publication Data
US 2021/0381657 A1  Dec. 9, 2021

Related U.S. Application Data

(63) Continuation-in-part of application No. 16/894,913, filed on Jun. 8, 2020, which is a continuation-in-part (Continued)

(30) Foreign Application Priority Data

Sep. 28, 2014 (CN) .......................... 201410510593.6
Feb. 2, 2015 (CN) .......................... 201510053077.X
(Continued)

(51) Int. Cl.
*F21K 9/232* (2016.01)
*F21K 9/238* (2016.01)
(Continued)

(52) U.S. Cl.
CPC .............. *F21K 9/232* (2016.08); *F21K 9/238* (2016.08); *H01L 25/0753* (2013.01);
(Continued)

(58) Field of Classification Search
CPC ................................. F21K 9/232; F21K 9/238
See application file for complete search history.

(56) References Cited

U.S. PATENT DOCUMENTS 3,437,636 A   4/1969  Angelo
5,262,505 A  11/1993  Nakashima et al.
(Continued)

FOREIGN PATENT DOCUMENTS

CN    1901206 A     1/2007
CN   201163628 Y   12/2008
(Continued)

*Primary Examiner* — William N Harris
(74) *Attorney, Agent, or Firm* — Simon Kuang Lu

(57) ABSTRACT

This application relates to the field of lighting, and discloses an LED filament including: at least one LED section, each LED section including at least two LED chips, adjacent LED chips being electrically connected to each other; electrodes, electrically connected to the LED section; and a light conversion layer, wrapping the LED section and parts of the electrodes, and including a top layer and a carrying layer, the carrying layer including a base layer and a transparent layer, the base layer including an upper surface and a lower surface opposite to each other, the upper surface of the base layer being in contact with a part of the top layer, and a part of the lower surface of the base layer being in contact with the transparent layer. This application has the characteristics of uniform light emission and good heat dissipation effect.

19 Claims, 20 Drawing Sheets

Related U.S. Application Data of application No. 16/748,070, filed on Jan. 21, 2020, now Pat. No. 10,784,428, which is a continuation-in-part of application No. 16/234,124, filed on Dec. 27, 2018, now Pat. No. 10,845,008, which is a continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 15/723,297, filed on Oct. 3, 2017, now Pat. No. 10,655,792, and a continuation-in-part of application No. 29/619,287, filed on Sep. 28, 2017, now Pat. No. Des. 862,740, said application No. 15/723,297 is a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, said application No. 15/723,297 is a continuation-in-part of application No. 15/308,995, filed on Nov. 4, 2016, now Pat. No. 10,781,979, said application No. 15/366,535 is a continuation-in-part of application No. 15/237,983, filed on Aug. 16, 2016, now Pat. No. 10,228,093, said application No. 15/723,297 is a continuation-in-part of application No. 15/168,541, filed as application No. PCT/CN2015/090815 on Sep. 25, 2015, now Pat. No. 9,995,474.

(30) Foreign Application Priority Data

| Date | | Number |
|---|---|---|
| Jun. 10, 2015 | (CN) | 201510316656.9 |
| Jun. 19, 2015 | (CN) | 201510347410.8 |
| Aug. 7, 2015 | (CN) | 201510489363.0 |
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 30, 2017 | (CN) | 201730520672.X |
| Nov. 3, 2017 | (CN) | 201730537542.7 |
| Nov. 3, 2017 | (CN) | 201730537544.6 |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Aug. 30, 2018 | (CN) | 201811005536.7 |
| Sep. 17, 2018 | (CN) | 201811079889.1 |
| Oct. 30, 2018 | (CN) | 201811277980.4 |
| Oct. 31, 2018 | (CN) | 201811285657.1 |
| Nov. 19, 2018 | (CN) | 201811378173.1 |
| Nov. 19, 2018 | (CN) | 201811378189.2 |
| Dec. 18, 2018 | (CN) | 201811549205.X |
| Jan. 22, 2019 | (CN) | 201910060475.2 |
| Jun. 10, 2019 | (CN) | 201910497661.2 |
| Nov. 1, 2019 | (CN) | 201911057715.X |
| Dec. 5, 2019 | (CN) | 201911234236.0 |
| Aug. 24, 2020 | (CN) | 202010856691.0 |
| Sep. 1, 2020 | (CN) | 202010904065.4 |
| Sep. 3, 2020 | (CN) | 202010912636.9 |
| Nov. 20, 2020 | (CN) | 202011313059.8 |
| Jan. 27, 2021 | (CN) | 202110108853.7 |
| Jul. 9, 2021 | (CN) | 202110779145.6 |

(51) Int. Cl.
    *H01L 25/075*     (2006.01)
    *H01L 33/62*     (2010.01)
    *H01L 33/50*     (2010.01)
    *F21Y 115/10*     (2016.01)

(52) U.S. Cl.
    CPC ............ *H01L 33/50* (2013.01); *H01L 33/62* (2013.01); *F21Y 2115/10* (2016.08); *H01L 2933/0041* (2013.01); *H01L 2933/0066* (2013.01)

(56) References Cited

U.S. PATENT DOCUMENTS

| | | |
|---|---|---|
| 5,859,181 A | 1/1999 | Zhao et al. |
| D422,099 S | 3/2000 | Kracke |
| 6,337,493 B1 | 1/2002 | Tanizawa et al. |
| 6,346,771 B1 | 2/2002 | Salam |
| 6,586,882 B1 | 7/2003 | Harbers |
| 7,041,766 B2 | 5/2006 | Yoneda et al. |
| D548,369 S | 8/2007 | Bembridge |
| D549,360 S | 8/2007 | An |
| D550,864 S | 9/2007 | Hernandez, Jr. et al. |
| 7,354,174 B1 | 4/2008 | Yan |
| 7,399,429 B2 | 7/2008 | Liu et al. |
| 7,482,059 B2 | 1/2009 | Peng et al. |
| 7,484,860 B2 | 2/2009 | Demarest et al. |
| 7,618,162 B1 | 11/2009 | Parkyn et al. |
| 7,618,175 B1 | 11/2009 | Hulse |
| 7,667,225 B1 | 2/2010 | Lee et al. |
| 7,810,974 B2 | 10/2010 | van Rijswick et al. |
| D629,929 S | 12/2010 | Chen et al. |
| 8,025,816 B2 | 9/2011 | Murase et al. |
| 8,240,900 B2 | 8/2012 | Van Rijswick et al. |
| 8,400,051 B2 | 3/2013 | Hakata et al. |
| 8,455,895 B2 | 6/2013 | Chai et al. |
| 8,604,678 B2 | 12/2013 | Dai et al. |
| 8,858,027 B2 | 10/2014 | Takeuchi et al. |
| 8,915,623 B1 | 12/2014 | Claudet |
| 8,933,619 B1 | 1/2015 | Ou |
| 8,981,636 B2 | 3/2015 | Matsuda et al. |
| 9,016,900 B2 | 4/2015 | Takeuchi et al. |
| 9,097,396 B2 | 8/2015 | Rowlette, Jr. |

(56) References Cited

U.S. PATENT DOCUMENTS

| | | | |
|---|---|---|---|
| 9,234,635 B2 | 1/2016 | Kwisthout | |
| 9,261,242 B2 | 2/2016 | Ge et al. | |
| 9,285,086 B2 | 3/2016 | Genier et al. | |
| 9,285,104 B2 | 3/2016 | Takeuchi et al. | |
| 9,360,188 B2 | 6/2016 | Kircher et al. | |
| 9,488,767 B2 | 11/2016 | Nava et al. | |
| 9,732,930 B2 | 8/2017 | Takeuchi et al. | |
| 9,761,765 B2 | 9/2017 | Basin et al. | |
| 9,909,724 B2 | 3/2018 | Marinus et al. | |
| 9,982,854 B2 | 5/2018 | Ma et al. | |
| 10,066,791 B2 | 9/2018 | Zhang | |
| 10,094,517 B2 | 10/2018 | Xiang | |
| 10,094,523 B2 | 10/2018 | Andrews | |
| 10,260,683 B2 * | 4/2019 | Bergmann | H05B 45/3577 |
| 10,218,129 B1 | 5/2019 | Lai et al. | |
| 10,281,129 B1 | 5/2019 | Lai et al. | |
| 10,323,799 B2 | 6/2019 | Huang | |
| 10,330,297 B2 | 6/2019 | Kwisthout | |
| 10,415,763 B2 | 9/2019 | Eckert | |
| 10,436,391 B2 | 10/2019 | Hsiao et al. | |
| 10,544,905 B2 | 1/2020 | Jiang et al. | |
| 10,655,792 B2 | 5/2020 | Jiang | |
| 10,794,545 B2 | 10/2020 | Jiang et al. | |
| 10,868,226 B2 | 12/2020 | Jiang et al. | |
| 10,969,063 B2 | 4/2021 | Schlereth et al. | |
| 11,143,363 B2 | 10/2021 | Feit | |
| 11,215,326 B2 * | 1/2022 | Yan | F21K 9/232 |
| 2003/0057444 A1 | 3/2003 | Niki et al. | |
| 2004/0008525 A1 | 1/2004 | Shibata | |
| 2004/0020424 A1 | 2/2004 | Sellin et al. | |
| 2004/0100192 A1 | 5/2004 | Yano et al. | |
| 2005/0001227 A1 | 1/2005 | Niki et al. | |
| 2005/0205881 A1 | 9/2005 | Yamazoe et al. | |
| 2005/0224822 A1 | 10/2005 | Liu | |
| 2005/0263778 A1 | 12/2005 | Hata et al. | |
| 2006/0046327 A1 | 3/2006 | Shieh et al. | |
| 2006/0163595 A1 | 7/2006 | Hsieh et al. | |
| 2007/0121319 A1 | 5/2007 | Wolf et al. | |
| 2007/0225402 A1 | 9/2007 | Choi et al. | |
| 2007/0267976 A1 | 11/2007 | Bohler et al. | |
| 2008/0128730 A1 | 6/2008 | Fellows et al. | |
| 2008/0137360 A1 | 6/2008 | Van Jijswick et al. | |
| 2009/0057704 A1 | 3/2009 | Seo et al. | |
| 2009/0059593 A1 | 3/2009 | Tsai | |
| 2009/0122521 A1 | 5/2009 | Hsu | |
| 2009/0152586 A1 | 6/2009 | Lee et al. | |
| 2009/0184618 A1 | 7/2009 | Hakata et al. | |
| 2009/0212698 A1 | 8/2009 | Bailey | |
| 2009/0251882 A1 | 10/2009 | Ratcliffe | |
| 2010/0025700 A1 | 2/2010 | Jung et al. | |
| 2010/0032694 A1 | 2/2010 | Kim et al. | |
| 2010/0047943 A1 | 2/2010 | Lee et al. | |
| 2010/0053930 A1 | 3/2010 | Kim et al. | |
| 2010/0135009 A1 | 6/2010 | Duncan et al. | |
| 2010/0200885 A1 | 8/2010 | Hsu et al. | |
| 2010/0265711 A1 | 10/2010 | Lee | |
| 2011/0001148 A1 | 1/2011 | Sun et al. | |
| 2011/0025205 A1 | 2/2011 | Van Rijswick et al. | |
| 2011/0026242 A1 | 2/2011 | Ryu et al. | |
| 2011/0031891 A1 | 2/2011 | Lee et al. | |
| 2011/0037397 A1 | 2/2011 | Lee et al. | |
| 2011/0043592 A1 | 2/2011 | Kinoshita et al. | |
| 2011/0049472 A1 | 3/2011 | Kim et al. | |
| 2011/0050073 A1 | 3/2011 | Huang | |
| 2011/0156086 A1 | 6/2011 | Kim et al. | |
| 2011/0210330 A1 | 9/2011 | Yang | |
| 2011/0210358 A1 | 9/2011 | Kim et al. | |
| 2011/0273863 A1 * | 11/2011 | Cai | F21K 9/60  362/84 |
| 2011/0278605 A1 | 11/2011 | Agatani et al. | |
| 2011/0303927 A1 | 12/2011 | Sanpei et al. | |
| 2012/0119647 A1 | 5/2012 | Hsu | |
| 2012/0145992 A1 | 6/2012 | Yoo et al. | |
| 2012/0161193 A1 | 6/2012 | Hassan | |
| 2012/0162965 A1 * | 6/2012 | Takeuchi | F21V 3/08  362/84 |
| 2012/0169251 A1 | 7/2012 | Lai et al. | |
| 2012/0175667 A1 | 7/2012 | Golle et al. | |
| 2012/0182757 A1 | 7/2012 | Liang et al. | |
| 2012/0256238 A1 | 10/2012 | Ning et al. | |
| 2012/0256538 A1 | 10/2012 | Takeuchi et al. | |
| 2012/0268936 A1 | 10/2012 | Pickard et al. | |
| 2012/0273812 A1 | 11/2012 | Takahashi et al. | |
| 2012/0281411 A1 | 11/2012 | Kajiya et al. | |
| 2012/0293721 A1 | 11/2012 | Ueyama | |
| 2012/0300432 A1 | 11/2012 | Matsubayashi et al. | |
| 2013/0003346 A1 | 1/2013 | Letoquin et al. | |
| 2013/0009179 A1 | 1/2013 | Bhat et al. | |
| 2013/0058080 A1 * | 3/2013 | Ge | F21K 9/66  362/249.02 |
| 2013/0058580 A1 | 3/2013 | Ge et al. | |
| 2013/0077285 A1 | 3/2013 | Isogai et al. | |
| 2013/0099271 A1 | 4/2013 | Hakata et al. | |
| 2013/0100645 A1 | 4/2013 | Ooya et al. | |
| 2013/0147348 A1 * | 6/2013 | Motoya | H01L 25/0753  313/498 |
| 2013/0169174 A1 | 7/2013 | Lee et al. | |
| 2013/0215625 A1 | 8/2013 | Takeuchi et al. | |
| 2013/0235592 A1 | 9/2013 | Takeuchi et al. | |
| 2013/0249381 A1 | 9/2013 | Takeuchi et al. | |
| 2013/0264591 A1 | 10/2013 | Hussell | |
| 2013/0264592 A1 | 10/2013 | Bergmann et al. | |
| 2013/0265796 A1 | 10/2013 | Kwisthout | |
| 2013/0271989 A1 | 10/2013 | Hussell et al. | |
| 2013/0277705 A1 | 10/2013 | Seo et al. | |
| 2013/0293098 A1 | 11/2013 | Li et al. | |
| 2013/0301252 A1 | 11/2013 | Hussell et al. | |
| 2013/0322072 A1 | 12/2013 | Pu et al. | |
| 2014/0022788 A1 | 1/2014 | Dan et al. | |
| 2014/0035123 A1 | 2/2014 | Seiji et al. | |
| 2014/0049164 A1 | 2/2014 | McGuire et al. | |
| 2014/0071696 A1 | 3/2014 | Park et al. | |
| 2014/0096901 A1 | 4/2014 | Hsieh et al. | |
| 2014/0103376 A1 | 4/2014 | Ou et al. | |
| 2014/0103794 A1 | 4/2014 | Ueda et al. | |
| 2014/0141283 A1 | 5/2014 | Lee et al. | |
| 2014/0152177 A1 | 6/2014 | Matsuda et al. | |
| 2014/0175465 A1 | 6/2014 | Lee et al. | |
| 2014/0185269 A1 | 7/2014 | Li | |
| 2014/0197440 A1 | 7/2014 | Ye et al. | |
| 2014/0217558 A1 | 8/2014 | Tamemoto | |
| 2014/0218892 A1 | 8/2014 | Edwards et al. | |
| 2014/0225514 A1 | 8/2014 | Pickard | |
| 2014/0228914 A1 | 8/2014 | van de Ven et al. | |
| 2014/0268779 A1 | 9/2014 | Sorensen et al. | |
| 2014/0362565 A1 | 12/2014 | Yao et al. | |
| 2014/0369036 A1 | 12/2014 | Feng | |
| 2015/0003038 A1 | 1/2015 | Liu | |
| 2015/0014732 A1 | 1/2015 | DeMille et al. | |
| 2015/0022114 A1 | 1/2015 | Kim | |
| 2015/0069442 A1 * | 3/2015 | Liu | F21K 9/232  257/98 |
| 2015/0070871 A1 * | 3/2015 | Chen | F21K 9/232  362/84 |
| 2015/0085485 A1 | 3/2015 | Park | |
| 2015/0085489 A1 | 3/2015 | Anderson | |
| 2015/0097199 A1 | 4/2015 | Chen et al. | |
| 2015/0171287 A1 | 6/2015 | Matsumura et al. | |
| 2015/0197689 A1 | 7/2015 | Tani et al. | |
| 2015/0211723 A1 | 7/2015 | Athalye | |
| 2015/0221822 A1 | 8/2015 | Kim et al. | |
| 2015/0255440 A1 | 9/2015 | Hsieh | |
| 2015/0312990 A1 | 10/2015 | van de Ven et al. | |
| 2015/0340347 A1 | 11/2015 | Jung et al. | |
| 2016/0056334 A1 | 2/2016 | Jang et al. | |
| 2016/0064628 A1 | 3/2016 | Fujii et al. | |
| 2016/0087003 A1 | 3/2016 | Lee et al. | |
| 2016/0116120 A1 | 4/2016 | Kwisthout | |
| 2016/0197243 A1 | 7/2016 | Lee et al. | |
| 2016/0238199 A1 | 8/2016 | Yeung et al. | |
| 2016/0348853 A1 | 12/2016 | Tanda et al. | |
| 2016/0369952 A1 | 12/2016 | Weekamp | |
| 2016/0372647 A1 | 12/2016 | Seo et al. | |

(56) References Cited

U.S. PATENT DOCUMENTS

| | | | |
|---|---|---|---|
| 2016/0377237 A1 | 12/2016 | Zhang | |
| 2017/0012177 A1 | 1/2017 | Trottier | |
| 2017/0016582 A1* | 1/2017 | Yang | F21K 9/232 |
| 2017/0040504 A1 | 2/2017 | Chen et al. | |
| 2017/0051877 A1 | 2/2017 | Weijers et al. | |
| 2017/0084809 A1 | 3/2017 | Jiang et al. | |
| 2017/0122498 A1 | 5/2017 | Zalka et al. | |
| 2017/0122499 A1 | 5/2017 | Lin et al. | |
| 2017/0138542 A1 | 5/2017 | Gielen et al. | |
| 2017/0138543 A1 | 5/2017 | Steele et al. | |
| 2017/0167663 A1 | 6/2017 | Hsiao et al. | |
| 2017/0167711 A1 | 6/2017 | Kadijk | |
| 2017/0299125 A1 | 10/2017 | Takeuchi et al. | |
| 2017/0299126 A1 | 10/2017 | Takeuchi et al. | |
| 2017/0330868 A1 | 11/2017 | Pu et al. | |
| 2018/0045380 A1 | 2/2018 | Li et al. | |
| 2018/0080612 A1 | 3/2018 | Haberkorn et al. | |
| 2018/0106435 A1 | 4/2018 | Wu et al. | |
| 2018/0119892 A1 | 5/2018 | Jiang et al. | |
| 2018/0172218 A1 | 6/2018 | Feit | |
| 2018/0230374 A1 | 8/2018 | Ito et al. | |
| 2019/0032858 A1 | 1/2019 | Cao et al. | |
| 2019/0049073 A1 | 2/2019 | Eckert | |
| 2019/0137047 A1 | 5/2019 | Hu | |
| 2019/0139943 A1 | 5/2019 | Tiwari et al. | |
| 2019/0186697 A1 | 6/2019 | Jiang et al. | |
| 2019/0195434 A1 | 6/2019 | Jiang et al. | |
| 2019/0219231 A1 | 7/2019 | Jiang et al. | |
| 2019/0219232 A1 | 7/2019 | Takeuchi et al. | |
| 2019/0242532 A1 | 8/2019 | Jiang et al. | |
| 2019/0264874 A1 | 8/2019 | Jiang et al. | |
| 2019/0264875 A1 | 8/2019 | Jiang et al. | |
| 2019/0264876 A1 | 8/2019 | Jiang et al. | |
| 2019/0271443 A1 | 9/2019 | Jiang et al. | |
| 2019/0277483 A1 | 9/2019 | Kwisthout | |
| 2019/0277484 A1 | 9/2019 | Kwisthout | |
| 2019/0301683 A1 | 10/2019 | Jiang et al. | |
| 2019/0301684 A1 | 10/2019 | Jiang et al. | |
| 2019/0309907 A1 | 10/2019 | Jiang et al. | |
| 2019/0315921 A1 | 10/2019 | Saito et al. | |
| 2019/0368666 A1 | 12/2019 | Jiang et al. | |
| 2019/0368667 A1 | 12/2019 | On et al. | |
| 2020/0035876 A1 | 1/2020 | Jiang et al. | |
| 2020/0049315 A1 | 2/2020 | Wu et al. | |
| 2020/0144230 A1 | 5/2020 | Lin et al. | |
| 2020/0176646 A1 | 6/2020 | Li | |
| 2021/0148533 A1 | 5/2021 | Van Bommel et al. | |

FOREIGN PATENT DOCUMENTS

| | | |
|---|---|---|
| CN | 201448620 U | 5/2010 |
| CN | 101826588 A | 9/2010 |
| CN | 102121576 A | 7/2011 |
| CN | 102209625 A | 10/2011 |
| CN | 202209551 U | 5/2012 |
| CN | 202252991 U | 5/2012 |
| CN | 202253168 U | 5/2012 |
| CN | 202473919 U | 10/2012 |
| CN | 202719450 U | 2/2013 |
| CN | 101968181 B | 3/2013 |
| CN | 102958984 A | 3/2013 |
| CN | 102969320 A | 3/2013 |
| CN | 202834823 U | 3/2013 |
| CN | 103123949 A | 5/2013 |
| CN | 203131524 U | 8/2013 |
| CN | 103335226 A | 10/2013 |
| CN | 203367275 U | 12/2013 |
| CN | 103542308 A | 1/2014 |
| CN | 103560128 A | 2/2014 |
| CN | 103682042 A | 3/2014 |
| CN | 203477967 U | 3/2014 |
| CN | 103872224 A | 6/2014 |
| CN | 103890481 A | 6/2014 |
| CN | 203628311 U | 6/2014 |
| CN | 203628391 U | 6/2014 |
| CN | 203628400 U | 6/2014 |
| CN | 203656627 U | 6/2014 |
| CN | 203671312 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203771136 U | 8/2014 |
| CN | 203857313 U | 10/2014 |
| CN | 203880468 U | 10/2014 |
| CN | 203907265 U | 10/2014 |
| CN | 203910792 U | 10/2014 |
| CN | 203932049 U | 11/2014 |
| CN | 203940268 U | 11/2014 |
| CN | 204062539 U | 12/2014 |
| CN | 104295945 A | 1/2015 |
| CN | 104319345 A | 1/2015 |
| CN | 204083941 U | 1/2015 |
| CN | 204088366 U | 1/2015 |
| CN | 204153513 U | 2/2015 |
| CN | 104456165 A | 3/2015 |
| CN | 104600174 A | 5/2015 |
| CN | 104600181 A | 5/2015 |
| CN | 204328550 U | 5/2015 |
| CN | 104716247 A | 6/2015 |
| CN | 204387765 U | 6/2015 |
| CN | 204459844 U | 7/2015 |
| CN | 204494343 U | 7/2015 |
| CN | 104913217 A | 9/2015 |
| CN | 104979455 A | 10/2015 |
| CN | 105042354 A | 11/2015 |
| CN | 105090789 A | 11/2015 |
| CN | 105098032 A | 11/2015 |
| CN | 105140381 A | 12/2015 |
| CN | 105161608 A | 12/2015 |
| CN | 105226167 A | 1/2016 |
| CN | 204986570 U | 1/2016 |
| CN | 105371243 A | 3/2016 |
| CN | 205081145 U | 3/2016 |
| CN | 105609621 A | 5/2016 |
| CN | 205264758 U | 5/2016 |
| CN | 205350910 U | 6/2016 |
| CN | 105789195 A | 7/2016 |
| CN | 106060630 A | 10/2016 |
| CN | 106468405 A | 3/2017 |
| CN | 106898681 A | 6/2017 |
| CN | 106939973 A | 7/2017 |
| CN | 107035979 A | 8/2017 |
| CN | 107123641 A | 9/2017 |
| CN | 107170733 A | 9/2017 |
| CN | 107204342 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 207849021 U | 9/2018 |
| CN | 109155306 A | 1/2019 |
| CN | 209354987 U | 9/2019 |
| CN | 111550687 A | 8/2020 |
| EP | 2535640 A1 | 12/2012 |
| EP | 2631958 A1 | 8/2013 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2006202500 A | 8/2006 |
| JP | 2012099726 A | 5/2012 |
| JP | 2013021346 A | 1/2013 |
| JP | 2013225587 A | 10/2013 |
| KR | 20140132517 A | 11/2014 |
| WO | 2012053134 A1 | 4/2012 |
| WO | 2014012346 A1 | 1/2014 |
| WO | 2014167458 A1 | 10/2014 |
| WO | 2017037010 A1 | 3/2017 |

(56) References Cited

FOREIGN PATENT DOCUMENTS

| | | |
|---|---|---|
| WO | 2017085063 A1 | 5/2017 |
| WO | 2017186150 A1 | 11/2017 |

\* cited by examiner

LED FILAMENT AND LIGHT BULB USING LED FILAMENT

CROSS-REFERENCE TO RELATED APPLICATIONS

This application claims priority to Chinese Patent Applications No. 202010856691.0 filed on 2020 Aug. 24; No. 202010912636.9 filed on 2020 Sep. 3; No. 202010904065.4 filed on 2020 Sep. 1; No. 202011313059.8 filed on 2020 Nov. 20; No. 202110108853.7 filed on 2021 Jan. 27; No. 202110779145.6 filed on 2021 Jul. 9, which is hereby incorporated by reference in its entirety.

This application is a continuation-in-part application of U.S. application Ser. No. 16/894,913 filed on 2020 Jun. 8, which is a continuation-in-part application of U.S. application Ser. No. 16/748,070 filed on 2020 Jan. 21, which is a continuation-in-part application of U.S. application Ser. No. 16/234,124 filed on 2018 Dec. 27, which is a continuation-in-part application of U.S. application Ser. No. 15/858,036 filed on 2017 Dec. 29.

The application Ser. No. 15/858,036 is a continuation-in-part application of U.S. application Ser. No. 15/499,143 filed on 2017 Apr. 27.

The application Ser. No. 15/858,036 is a continuation-in-part application of U.S. application Ser. No. 15/723,297 filed on 2017 Oct. 3.

The application Ser. No. 15/858,036 is a continuation-in-part application of U.S. application Ser. No. 29/619,287 filed on 2017 Sep. 28.

The application Ser. No. 15/858,036 is a continuation-in-part application of U.S. application Ser. No. 29/627,379 filed on 2017 Nov. 27.

The application Ser. No. 16/894,913 claims priority to Chinese Patent Applications No. 201910497661.2 filed on 2019 Jun. 10; No. 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201410510593.6 filed on 2014 Sep. 28; No. 201510053077.X filed on 2015 Feb. 2; No. 201510316656.9 filed on 2015 Jun. 10; No. 201510347410.8 filed on 2015 Jun. 19; No. 201510489363.0 filed on 2015 Aug. 7; No. 201510555889.4 filed on 2015 Sep. 2; No. 201710316641.1 filed on 2017 May 8; No. 201710839083.7 filed on 2017 Sep. 18; No. 201710883625.0 filed on 2017 Sep. 26; No. 201730450712.8 filed on 2017 Sep. 21; No. 201730453239.9 filed on 2017 Sep. 22; No. 201730453237.X filed on 2017 Sep. 22; No. 201730537542.7 filed on 2017 Nov. 3; No. 201730537544.6 filed on 2017 Nov. 3; No. 201730520672.X filed on 2017 Oct. 30; No. 201730517887.6 filed on 2017 Oct. 27; No. 201730518659.0 filed on 2017 Oct. 27; No. 201730489929.X filed on 2017 Oct. 16; No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201910060475.2 filed on 2019 Jan. 22; No. 201811378189.2 filed on 2018 Nov. 19; No. 201811549205.X filed on 2018 Dec. 18; No. 201911057715.X filed on 2019 Nov. 1; No. 201911234236.0 filed on 2019 Dec. 5, each of which is hereby incorporated by reference in its entirety.

TECHNICAL FIELD

This application relates to the field of lighting, and in particular, to an LED filament and a light bulb using the LED filament.

BACKGROUND

LEDs have the advantages of environmental protection, energy saving, high efficiency, and long life. Therefore, LEDs have been generally valued in recent years and gradually replaced the status of conventional lighting lamps. However, the light of conventional LED light sources is directional unlike the conventional lamps that can provide wide-angle illumination. Therefore, the application of LEDs to the conventional lamps has corresponding challenges depending on lamp types.

In recent years, an LED filament that allows the LED light sources to emit light like conventional tungsten filament light bulbs to achieve 360° full-angle illumination has gradually attracted the attention of the industry. This kind of LED filament is made by fixing a plurality of LED chips in series on a narrow and slender glass substrate, and then wrapping the entire glass substrate with phosphor-doped silica glue, and then performing electrical connection. In addition, there is one kind of LED soft filament, which is similar to the structure of the above-mentioned LED filament. A flexible printed circuit (hereinafter refer to FPC) substrate is used instead of the glass substrate to enable the filament to have a certain degree of bending. However, the soft filament made of the FPC has the following disadvantages, in an example, the FPC has a coefficient of thermal expansion different from that of the silica glue wrapping the filament, causing displacement or even degumming of the LED chips in long-term use; furthermore, the FPC may not beneficial to flexible adjustment of process conditions and the like.

A soft filament was disclosed (for example, in some of the embodiments of Chinese Patent Publication No. CN106468405A), where a soft filament structure without a carrying substrate is provided, which replaces a conventional structure in which chips have to be mounted on a substrate first and then coated with phosphor/encapsulated with a flexible fluorescent encapsulated body with wavelength conversion function. However, a part of the filament structure poses a challenge related to the stability of metal wire bonded between chips while they are being bent. When the arrangement of the chips in the filament is dense, if the adjacent LED chips are connected in a manner of metal wire bonding, it is prone to cause stress to be concentrated on a specific part of the filament when the filament is bent, so that the bonded metal wires connecting the LED chips are damaged or even broken. Therefore, some embodiments still have room for improvement in quality.

In the related art, most LED lamps use blue LED chips and yellow phosphor to emit white light, but an emission spectrum of the LED lamps shows that light in the red light region is weak and has a low color rendering index, making it difficult to achieve low color temperature. To increase the color rendering index, a certain amount of green phosphor and red phosphor are generally added, but the relative conversion rate of the red phosphor is relatively low, usually causing a total luminous flux of the LED lamps to decrease, that is, the light efficiency decreases.

This application is to further optimize the above-mentioned application to further respond to various different manufacturing processes and product requirements.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

At present, LED filament lamps generally use a driving power supply to convert alternating current into direct current before driving to emit light. However, there are ripples in the process of converting alternating current into direct current by the driving power supply, causing flicker in the LED filament during light emitting. To reduce or even eliminate the flicker generated in the LED filament during light emitting, an electrolytic capacitor is usually added for ripple removal in the driving power supply. Heat generated by a heating element in the driving power supply greatly affects the service life of the electrolytic capacitor.

SUMMARY

It is noted that the present disclosure includes one or more inventive solutions currently claimed or not claimed, and in order to avoid confusion between the illustration of these embodiments in the specification, a number of possible inventive aspects herein may be collectively referred to as "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

It is an object of the claimed invention to provide an LED filament, comprising:
at least one LED section, each LED section comprising at least two LED chips electrically connected to each other;
electrodes, electrically connected to the LED section; and
a light conversion layer, wrapping the LED section and parts of the electrodes, and comprising a top layer and a carrying layer, the carrying layer comprising a base layer and a transparent layer, the base layer comprising an upper surface and a lower surface opposite to each other, wherein the upper surface of the base layer being in contact with a part of the top layer, and a part of the lower surface of the base layer being in contact with the transparent layer, and the light conversion layer has a first end and a second end opposite to the first end, and the LED chips are located between the first end and the second end.

In accordance with an embodiment of the present invention, the total length of the transparent layer is 10-80% of the total length of the base layer.

In accordance with an embodiment of the present invention, the transparent layer comprises a first transparent layer and a second transparent layer, the first transparent layer extends from one end of the base layer, and the second transparent layer extends from the other end of the base layer.

In accordance with an embodiment of the present invention, a gap is formed between the first transparent layer and the second transparent layer, and in the length direction of the LED filament, the distance between the first transparent layer and the second transparent layer is greater than the length of the first transparent layer or the second transparent layer.

In accordance with an embodiment of the present invention, the LED chip closest to the first end is denoted as LED chip n1, then LED chips from the first end to the second end are sequentially LED chip n2, LED chip n3, . . . , and LED chip nm, m being an integer and m≤800, and in the length direction of the LED filament, the length of the first transparent layer or the second transparent layer is at least greater than the distance from the first end to the LED chip n2.

In accordance with an embodiment of the present invention, there are at least two LED chips every millimeter of a top layer length on average, and the temperature of the LED filament is not greater than the junction temperature when the LED filament is lit for 15,000 h in a surrounding environment at 25° C.

In accordance with an embodiment of the present invention, further comprising conductive sections connecting adjacent LED sections, the shortest distance between two LED chips respectively located in two adjacent LED sections being greater than the distance between two adjacent LED chips in the LED section.

In accordance with another embodiment of the present invention, an LED light bulb, comprising:
a lamp housing;
a lamp cap, connected to the lamp housing;
a stem, comprising a stand located in the lamp housing;
an LED filament, located in the lamp housing, the LED filament comprising:
at least one LED section, each LED section comprising at least two LED chips, adjacent LED chips being electrically connected to each other;
electrodes, electrically connected to the LED section; and
a light conversion layer, wrapping the LED section and parts of the electrodes, and comprising a top layer and a carrying layer, the carrying layer comprising a base layer and a transparent layer, the base layer comprising an upper surface and a lower surface opposite to each other, the upper surface of the base layer being in contact with a part of the top layer, and a part of the lower surface of the base layer being in contact with the transparent layer; and
at least one supporting arm, each supporting arm comprising a first end and a second end that are opposite to each other, the first end of each supporting arm being connected to the stand, and the second end of each supporting arm being connected to the LED filament.

In accordance with an embodiment of the present invention, a plane A divides the lamp housing into an upper portion and a lower portion, and the lamp housing has the largest width at the plane A, when there is an intersection between the stem and the plane A, the lamp housing has a lamp housing top portion and a lamp housing bottom portion that are opposite to each other, the lamp housing bottom portion is close to the lamp cap, and the length of the LED filament located between the lamp housing top portion and the plane A is less than the length of the LED filament located between the plane A and the lamp housing bottom portion.

In accordance with an embodiment of the present invention, a plane A divides the lamp housing into an upper portion and a lower portion, and the lamp housing has the largest width at the plane A, when there is an intersection between the stem and the plane A, the lamp housing has a lamp housing top portion and a lamp housing bottom portion that are opposite to each other, the lamp housing bottom portion is close to the lamp cap, and in the height direction of the LED light bulb, the distance from the highest point of the LED filament to the plane A is less than the distance from the lowest point of the LED filament to the plane A In accordance with an embodiment of the present invention, a plane A divides the lamp housing into an upper portion and a lower portion, and the lamp housing has the largest width at the plane A, when there is a distance between the stem and the plane A, and the distance from a stem top portion to the plane A is less than the height of the stand, the stem comprises a stem bottom portion and a stem top portion opposite to each other, the stem bottom portion is connected to the lamp cap, the stem top portion extends to the direction of the lamp housing top portion, and the length of the LED filament located between the stem top portion and the lamp housing top portion is less than the length of the LED filament located between the stem top portion and the lamp housing bottom portion.

In accordance with an embodiment of the present invention, a plane A divides the lamp housing into an upper portion and a lower portion, and the lamp housing has the largest width at the plane A, when there is a distance between the stem and the plane A, and the distance from a stem top portion to the plane A is less than the height of the stand, the stem comprises a stem bottom portion and a stem top portion, the stem bottom portion is connected to the lamp cap, the stem top portion extends to the direction of the lamp housing top portion, and the distance between the highest point of the LED filament and the stem top portion is less than the distance between the stem top portion and the lowest point of the LED filament.

In accordance with an embodiment of the present invention, the LED section comprises a first section and a second section, the first section and the second section to the lamp housing respectively have a first distance and a second distance that are opposite to each other, and the first distance is less than the second distance.

In accordance with an embodiment of the present invention, in the first distance direction, the base layer of the LED filament is close to the lamp housing, and the top layer of the LED filament is away from the lamp housing.

In accordance with an embodiment of the present invention, a Cartesian coordinate system having an X-axis, a Y-axis and a Z-axis being oriented for the LED light bulb, wherein the Z-axis is parallel to the stem, each supporting arm has an intersection with the LED filament, and on the XY-plane, at least two intersections are located on a circumference of a circle taking the stem as a center.

In accordance with an embodiment of the present invention, the LED filament further comprises conductive sections connecting adjacent LED sections, at least one intersection and the bending point of the conductive section 130 form a straight line La, the intersection on the straight line La and the electrode of the filament form a straight line Lb, and the range of the angle α between the straight line La and the straight line Lb is 0°<α<90°.

In accordance with an embodiment of the present invention, the spectral intensity of the light emitted by the LED filament has three peaks P1', P2', and P3' between wavelengths of 400 nm to 800 nm, the peak P1' is between the wavelengths from 430 nm to 480 nm, the peak P2' is between the wavelengths from 480 nm to 530 nm, and the peak P3' is between the wavelengths from 630 nm to 680 nm.

In accordance with an embodiment of the present invention, an average color rendering index of the LED light bulb is greater than 95, and a luminous efficiency of the LED filament is greater than or equal to 100 lm/W.

In accordance with an embodiment of the present invention, there are at least two LED chips every millimeter of a top layer length on average, and the temperature of the LED filament is not greater than the junction temperature when the LED filament is lit for 15,000 hours in a surrounding environment at 25° C.

This application has the following or any combination of technical effects through the above-mentioned technical solutions: (1) by filling the lamp housing with a combination of nitrogen and oxygen, the service life of a base layer can be effectively increased due to the action of oxygen and groups in the base layer; and (2) By designing the relationship among a diameter of the lamp cap, a maximum diameter of the lamp housing, and a maximum width in the Y-axis direction on the YZ-plane or a maximum width in the X-axis direction on the XZ-plane of the LED filament, the heat dissipation effect of the light bulb can be effectively improved.

DETAILED DESCRIPTION

Figure 1A:
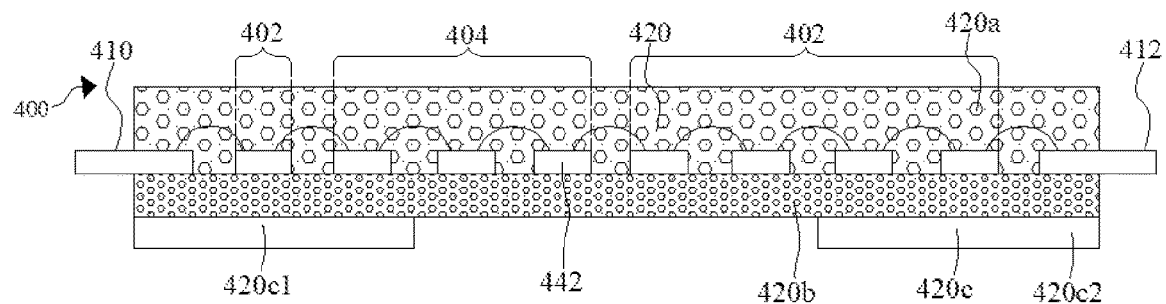
FIG. 1A is a schematic structural diagram of another embodiment of an LED filament according to this application.

To make the above-mentioned objectives, features, and advantages of this application more apparent and comprehensible, specific embodiments of this application are described in detail below with reference to the accompanying drawings.

As shown in FIG. 1A to FIG. 1H, FIG. 2A to FIG. 2C, and FIG. 3A to FIG. 3E, an LED filament includes a light conversion layer 220/420, LED chip units 202/204 (or LED sections 402/404), and electrodes (or conductive electrodes) 210, 212/410, 412. The light conversion layer 220/420 wraps the LED chip units 202/204 (or LED sections 402/404) and parts of the electrodes (or conductive electrodes) 210, 212/410, 412, and parts of the electrodes (or conductive electrodes) 210, 212/410, 412 are exposed outside the light conversion layer 220/420, the adjacent LED chip units 202, 204 (or LED sections 402, 404) are electrically connected to each other, and the LED chip units 202/204 (or LED sections 402/404) and the electrodes (or conductive electrodes) 210, 212/410, 412 are electrically connected. The LED filament includes at least two LED chips 442, the two adjacent LED chips 442 are electrically connected to each other, the LED chip units 202/204 (or LED sections 402/404) include at least one LED chip 442 with an upper surface and a lower surface opposite to each other, the light conversion layer 420 includes a top layer 420a and a carrying layer, and the top layer 420a and the carrying layer may separately be a layered structure having at least one layer. The layered structure may be selected from: a phosphor glue with high plasticity (relative to a phosphor film), a phosphor film with low plasticity, a transparent layer, or any combination of the three. The phosphor glue/phosphor film includes the following components: organosilicon-modified polyimide and/or glue. The phosphor glue/phosphor film may also include phosphor and inorganic oxide nanoparticles (or heat dissipation particles). The transparent layer may be composed of light-transmitting resin (such as silica glue and polyimide) or a combination thereof. The glue may be, but is not limited to, silica glue. In one embodiment, materials of the top layer 420a and the carrying layer are the same. In one embodiment, the carrying layer includes a base layer, and in the height direction of the LED filament, the height of the top layer is greater than the height of the base layer. The base layer includes an upper surface and a lower surface opposite to each other, and the top layer includes an upper surface and a lower surface opposite to each other, where the upper surface of the base layer is in contact with a part of the lower surface of the top layer; the upper surface of the LED chip is close to the upper surface of the top layer relative to the lower surface of the LED chip, and the distance from the lower surface of the LED chip to the lower surface of the base layer is less than the distance from the lower surface of the LED chip to the upper surface of the top layer, because the thermal conductivity of the top layer is greater than the thermal conductivity of the base layer, and the heat transfer from the LED chip to the outer surface of the base layer is shorter, so the heat is not easy to collect, and the heat dissipation effect of the LED filament is good. In one embodiment, if the LED filament is supplied with electrical power no more than 8 W, when the LED filament is lit, at least 4 lm luminous flux of light is emitted every millimeter of a LED filament length on average or a filament body length on average or a top layer length on average. In one embodiment, there are at least two LED chips every millimeter of a LED filament length on average or a filament body length on average or a top layer length on average. In an environment at 25° C., the temperature of the LED filament is not greater than the junction temperature when the LED filament is lit for 15,000 h.

FIG. 1A is a schematic structural diagram of an embodiment of an LED filament according to this application. An LED filament 400 includes: a light conversion layer 420, LED sections 402/404, and electrodes 410/412. The LED sections 402/404 have at least one LED chip 442. In the LED filament, the two adjacent LED chips are electrically connected to each other, and the LED chips and the electrodes 410/412 are electrically connected. For example, the electrical connection may be achieved by using a circuit film or a first conductive wire in FIG. 1B described below. The light conversion layer 420 includes a top layer 420a and a carrying layer, the carrying layer includes a base layer 420b and a transparent layer 420c, and the base layer 420b is located between the top layer 420a and the transparent layer 420c (at least located on a certain section of the LED filament 400). In one embodiment, the base layer 420b includes an upper surface and a lower surface opposite to each other, the upper surface of the base layer 420b is in contact with a part of the top layer 420a, and the lower surface of the base layer 420b is in contact with the transparent layer 420c. In some embodiments, a part of the lower surface of the base layer 420b is in contact with the transparent layer 420c, and the transparent layer 420c supports a part of the base layer 420b, thereby enhancing the strength of the base layer 420b and facilitating die bonding, and the part of the base layer 420b that is not covered by the transparent layer 420c can allow heat generated by some LED chips 442 to be directly dissipated through the base layer 420b. In this embodiment, the total length of the base layer 420b is the same as the total length of the top layer 420a. In one embodiment, the total length of the transparent layer 420c is 5-100% of the total length of the base layer 420b. In one embodiment, the length of the transparent layer 420c is less than that of the base layer 420b, the total length of the transparent layer 420c is 10-80% of the total length of the base layer 420b. In one embodiment, the total length of the transparent layer 420c is 10-50% of the total length of the base layer 420b. When the LED filament is thinner (for example, the width of the LED filament is <120 μm), the heat dissipation area of the LED chips 442 is relatively reduced. By providing the transparent layer 420c located below the base layer 420b, on the one hand, the deformation of the base layer 420b caused by heating can be reduced; and on the other hand, the transparent layer 420c can assist in supporting the LED chips 442, helping die bonding. In one embodiment, the transparent layer 420c includes a first transparent layer 420c1 and a second transparent layer 420c2. The first transparent layer 420c1 and the second transparent layer 420c2 both extend in the length direction of the LED filament 400. The first transparent layer 420c1 extends from one end of the base layer 420b, the second transparent layer 420c2 extends from the other end of the base layer 420b, and the extending direction of the first transparent layer 420c1 is opposite to the extending direction of the second transparent layer 420c2. In one embodiment, the light conversion layer 420 has a first end and a second end opposite to the first end. In one embodiment, the LED chips 442 are located between the first end and the second end of the light conversion layer 420. If the LED chip 442 closest to the first end is denoted as LED chip $n_1$, then LED chips from the first end to the second end are sequentially LED chip $n_2$, LED chip $n_3$, ..., and LED chip $n_m$, where m is an integer and m≤800. In one embodiment, the value of m is 50≤m≤300. In the length direction of the LED filament 400, the length of the first transparent layer 420c1/ the second transparent layer 420c2 is at least greater than the distance from the first end of the light conversion layer 420a to the LED chip $n_2$. There is a gap between the first transparent layer 420c1 and the second transparent layer 420c2. In the length direction of the LED filament 400, the distance between the first transparent layer 420c1 and the second transparent layer 420c2 is greater than the length of the first transparent layer 420c1 and/or the second transparent layer 420c2. When the LED filament 400 is bent, the electrode 410/412 is prone to be separated from the light conversion layer 420, or the part where the light conversion layer 420 is in contact with the electrode 410/412 is prone to cracks. The first transparent layer 420c1 and the second transparent layer 420c2 can perform structural reinforcement on the part where the light conversion layer 420 is in contact with the electrodes 410,412, which prevents the part where the light conversion layer 420 is in contact with the electrodes 410,412 from cracks.

Figure 1B:
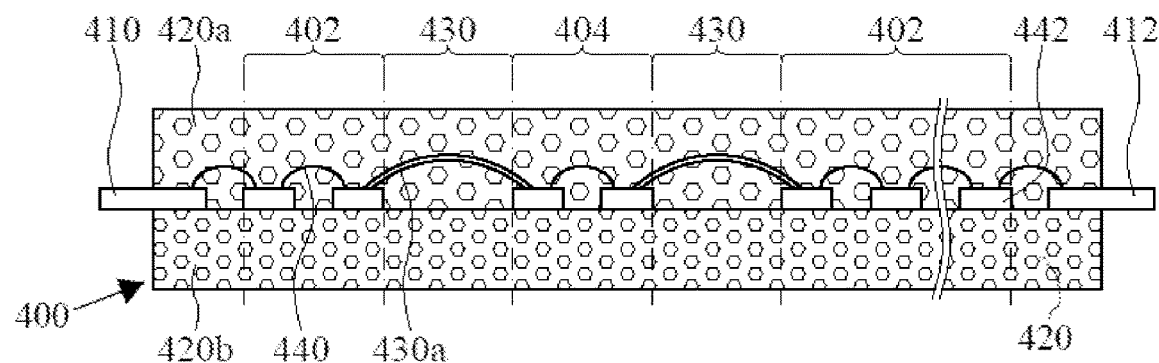
FIG. 1B is a schematic structural diagram of another embodiment of an LED filament according to this application.

FIG. 1B is a schematic structural diagram of another embodiment of an LED filament according to this application. As shown in FIG. 1B, an LED filament 400 includes: a light conversion layer 420, LED sections 402, 404, electrodes 410, 412, and conductive sections 430 configured to electrically connect two adjacent LED sections 402, 404. The LED sections 402, 404 include at least two LED chips 442, and two adjacent LED chips 442 are electrically connected to each other by a first conductive wire 440. In this embodiment, the conductive section 430 includes a conductor 430a connecting the LED sections 402, 404. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a. Therefore, it is ensured that, when bending occurs between the two LED sections 402, 404, the conductive section 430 is not easily broken due to the stress generated. The light conversion layer 420 is coated on at least two sides of the LED chips 442/the electrodes 410, 412. Parts of the electrodes 410, 412 are exposed outside the light conversion layer 420. The light conversion layer 420 has a top layer 420a and a carrying layer as an upper layer and a lower layer of the LED filament 400 respectively. In this embodiment, the carrying layer includes a base layer 420b, and the base layer 420b includes an upper surface and a lower surface opposite to the upper surface. The upper surface of the base layer 420b is close to the top layer 420a relative to the lower surface of the base layer 420b. The LED sections 402/404 and parts of the electrodes 410/412 are disposed on the upper surface of the base layer 420b, or at least one side of the LED sections 402/404 is in contact (direct contact or indirect contact) with the upper surface of the base layer 420b.

Figure 1C:
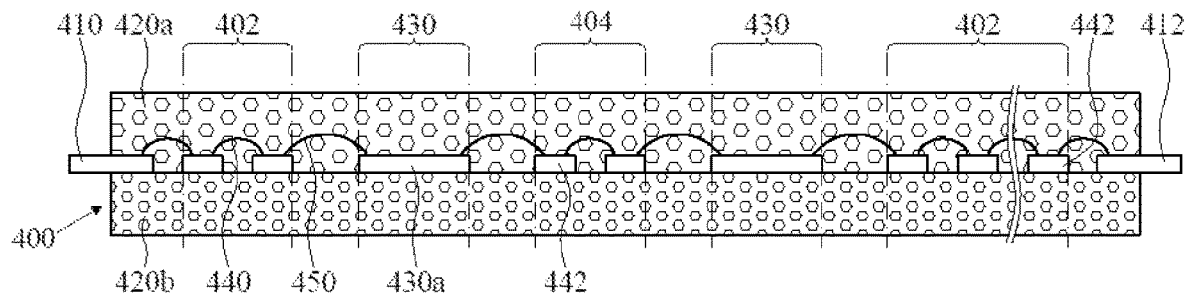
FIG. 1C is a schematic structural diagram of another embodiment of an LED filament according to this application.

As shown in FIG. 1C, in this embodiment, the conductive section 430 is also located between the two adjacent LED sections 402, 404, and a plurality of the LED chips 442 in the LED sections 402, 404 are electrically connected to each other by the first conductive wires 440. However, the conductor 430a in the conductive section 430 in FIG. 1C is not in the form of a conductive wire but in a sheet or film form. In some embodiments, the conductor 430a may be copper foil, gold foil, or other materials that can perform electrical conduction. In this embodiment, the conductor 430a is attached to the surface of the base layer 420b and adjacent to the top layer 420a, that is, located between the base layer 420b and the top layer 420a. Moreover, the conductive section 430 and the LED sections 402, 404 are electrically connected by second conductive wires 450, that is, the two LED chips 442 respectively located in two adjacent LED sections 402, 404 and having the shortest distance from the conductive section 430 are electrically connected to the conductor 430a in the conductive section 430 by the second conductive wires 450. The length of the conductive section 430 is greater than the distance between two adjacent LED chips 442 in one LED section 402/404, and the length of the first conductive wire 440 is less than the length of the conductor 430a. This design ensures that the conductive section 430 has good bendability because the conductive section 430 has a relatively long length. Assuming that a maximum thickness of the LED chip 442 in the radial direction of the filament is H, the thickness of the electrodes 410, 412 and the conductor 430a in the radial direction of the LED filament is 0.5H to 1.4H, preferably 0.5H to 0.7H. Due to the height difference between the LED chip 442 and the electrode 410/412, the LED chip 442 and the conductor 430a, it can ensure the wire bonding process can be carried out while ensures the quality of the wire bonding process (that is, having good strength), thereby improving the stability of the product.

Figure 1D:
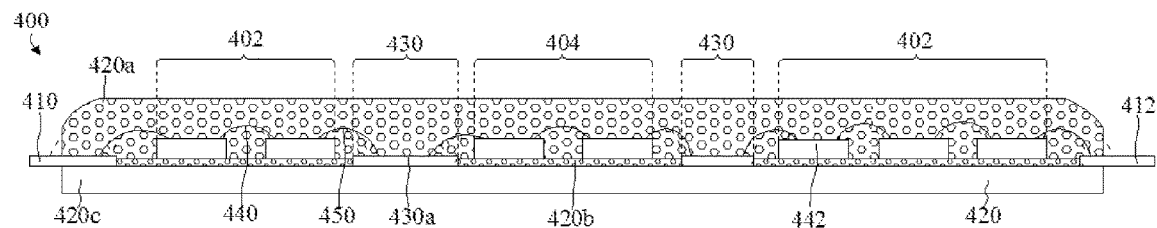
FIG. 1D to FIG. 1G are schematic structural diagrams of a plurality of embodiments of an LED filament according to this application.

As shown in FIG. 1D, an LED filament 400 includes: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The LED chips 442 are electrically connected to each other by the first conductive wire 440. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a.

Therefore, it is ensured that, when bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer 420a and a carrying layer, the carrying layer includes a base layer 420b and a transparent layer 420c, and the base layer 420b is located between the top layer 420a and the transparent layer 420c. The base layer 420b and the top layer 420a cover at least two sides of the LED chips 442. The thermal conductivity of the transparent layer 420c is greater than the thermal conductivity of the base layer 420b. The thickness of the base layer 420b in the radial direction of the LED filament 400 is less than or equal to the thickness of the conductor 430a in the radial direction of the LED filament 400. When the LED filament is thinner (for example, the width of the LED filament is ≤120 μm), the heat dissipation area of the LED chips is relatively reduced. By providing the transparent layer 420c located below the base layer 420b, on the one hand, the deformation of the base layer 420b caused by heating can be reduced, and on the other hand, the transparent layer 420c can assist in supporting the LED chips 442, helping die bonding. For example, the transparent layer 420c may be a hard substrate such as an alumina ceramic plate or a sapphire substrate, or a soft substrate with high thermal conductivity (for example, the thermal conductivity ≥2.0 (W/(m·K))). A translucent alumina ceramic plate or a transparent sapphire substrate facilitates the penetration of the light emitted by the LED chips 442 toward the transparent layer 420c, thereby realizing omnidirectional light of the LED filament 400. In this embodiment, the top layer 420a, the base layer 420b, and the transparent layer 420c wrap the conductor 430a. On one hand, the impact of the external environment on the conductor 430a is reduced, and on the other hand, the carrying capacity of the conductor 430a in electrical connection is improved, and the stability of the electrical connection when the conductor 430a is bent is improved. In some embodiments, the thickness of the base layer 420b in the height direction of the LED filament 400 is less than or equal to the thickness of the conductor 430a in the height direction of the LED filament 400. The heat conduction path of the heat generated by the LED chips 442 to the transparent layer 420c is short, improving the heat dissipation effect of the LED filament 400. In other embodiments, the thickness of the transparent layer 420c in the height direction of the LED filament 400 is greater than the thickness of the base layer 420b in the height direction of the LED filament 400. The heat conduction path of the heat generated by the LED chips 442 to the transparent layer 420c is short, such that the heat dissipation effect of the LED filament 400 is improved. In some embodiments, the absolute value of the height difference between the LED chip 442 and the conductor 430a in the height direction of the LED filament 400 is greater than the height of the LED chip 442 in the height direction of the LED filament 400. When the LED filament 400 is bent, the second conductive wire 450 is less deformed after being stretched under force, and the second conductive wire 450 is not prone to be broken. In some embodiments, the base layer 420b is in contact with at least one side of the LED chips 442 and one side of the conductive section 430. In this embodiment, the LED chips 442 and the conductors 430a are located on different sides of the base layer 420b.

Figure 1E:
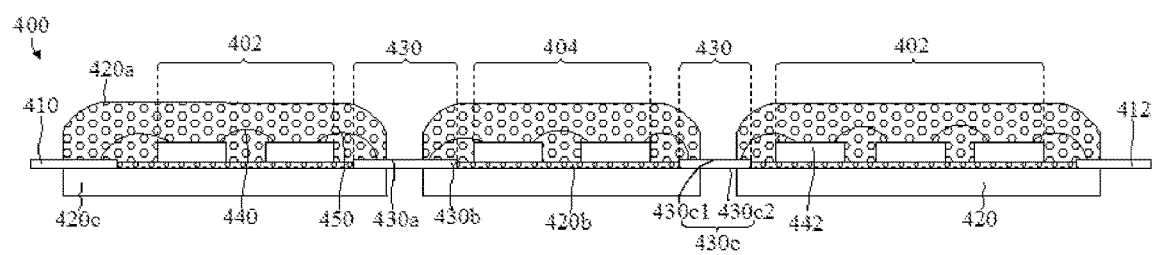
Figure 1F:
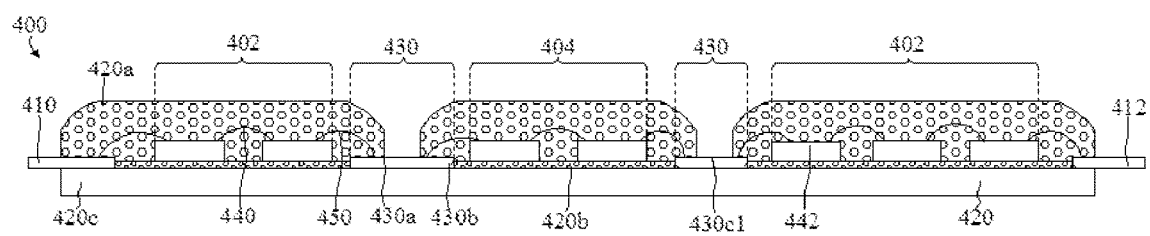
Figure 1G:
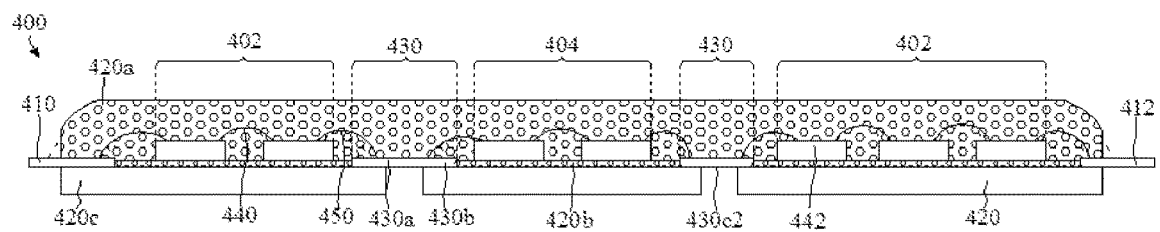

Referring to FIG. 1E to FIG. 1G, in some embodiments, the conductor 430a includes a covering portion 430b and an exposed portion 430c, and the length of the exposed portion 430c in the axial direction of the LED filament 400 is less than the distance between adjacent LED chips 442 in any LED section 402/404. When the LED filament 400 is bent, the exposed portion 430c is slightly deformed under force with a small bending region and a small deformation degree, which is beneficial to keeping a bending shape of the LED filament 400. As shown in FIG. 1E, the exposed portion 430c includes a first exposed portion 430c1 and a second exposed portion 430c2, the portion of the top layer 420a where the conductor 430a is exposed is the first exposed portion 430c1, and the portion of the transparent layer 420c where the conductor 430a is exposed is the second exposed portion 430c2. The length of the first exposed portion 430c1 in the axial direction (length direction) of the LED filament 400 is greater than or equal to the length of the second exposed portion 430c2 in the axial direction of the LED filament 400 to ensure the stability of the electrical connection and the uniform force when the conductor 430a is bent. As shown in FIG. 1F, the exposed portion only includes the first exposed portion 430c1. The length of the first exposed portion 430c1 in the axial direction of the LED filament is less than or equal to the distance between adjacent LED chips in any LED section 402/404. When the LED filament 400 is bent, the stress generated during the bending is concentrated on the conductive section 430, which reduces the risk of breakage of the conductive wires 440 connecting adjacent LED chips 442. As shown in FIG. 1G, the exposed portion only includes the second exposed portion 430c2, which can relieve stress concentration of the conductors 430a. The length of the second exposed portion 430c2 in the axial direction of the LED filament 400 is less than or equal to the distance between adjacent LED chips 442 in any LED section 402/404. Since a part of the conductors 430a are located between adjacent transparent layers 420c, the stability of the support of the transparent layers 420c to the conductors 430a can be ensured.

Figure 1H:
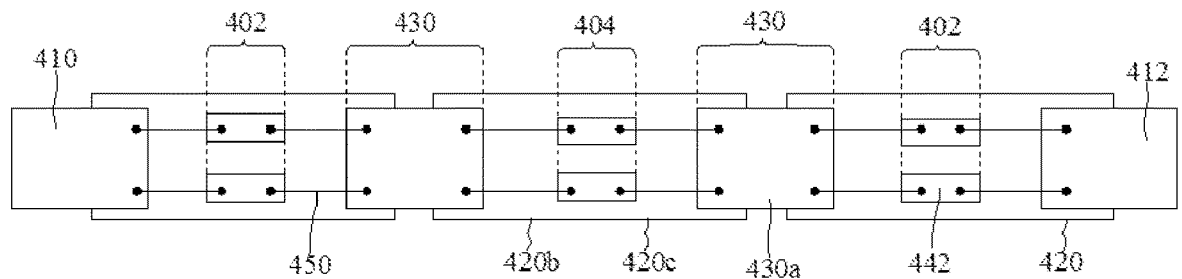
FIG. 1H is a top view of an embodiment of an LED filament with a top layer removed according to this application.

Referring to FIG. 1H, an LED filament 400 has: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, the two adjacent LED chips 442 are electrically connected to each other by the first conductive wire 440, and the length of the first conductive wire 440 is less than the length of the conductor 430a. When bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer (not shown) and a carrying layer. The carrying layer includes a base layer 420b and a transparent layer 420c. The LED chips 442 in the LED section 402/404 are arranged along the radial direction of the LED filament (or the width direction of the LED filament). Each LED chip 442 in the LED section 402/404 is connected to the conductor 430a and/or the electrode 410/412. In this embodiment, the widths of the base layer 420b and the transparent layer 420c in the radial direction of the LED filament are equal, the contact area between the base layer 420b and the transparent layer 420c is large, and there is no delamination between the base layer 420b and the transparent layer 420c. In other embodiments, the width of the base layer 420b in the radial direction of the LED filament is less than the width of the transparent layer 420c in the radial direction of the LED filament, the top layer (not shown) is in contact with the base layer 420b and the transparent layer 420c, and the thickness of the base layer 420b is less than the thickness of the top layer. The heat emitted by the LED chips 442 is conducted to the top layer and the transparent layer 420c at the same time through the base layer 420b, thereby improving the heat dissipation efficiency of the LED filament. Besides, the top layer and the transparent layer 420c completely wrap the base layer 420b, which can protect the base layer 420b from the external environment, and further can reduce the probability of the breakage of the second conductive wires 450 due to the protection from a plurality of sides of the top layer when the LED filament is bent, improving the yield of the product.

Figure 2A:
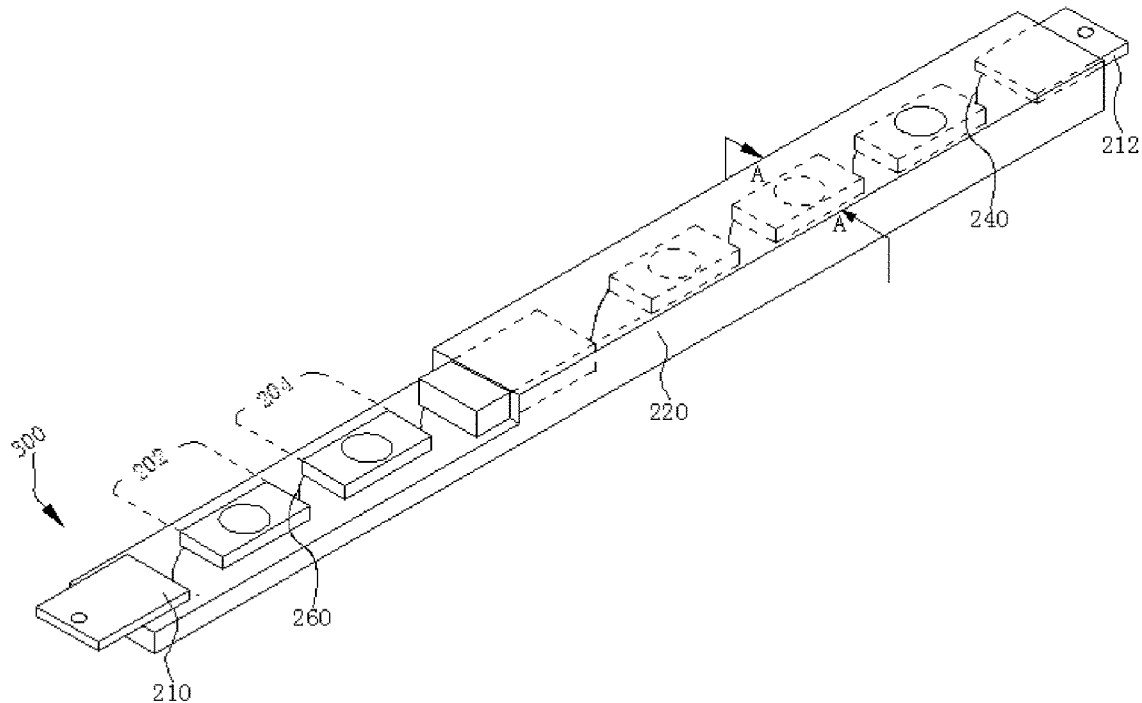
FIG. 2A is a schematic structural diagram of an embodiment of an LED filament according to this application.
Figure 2B:
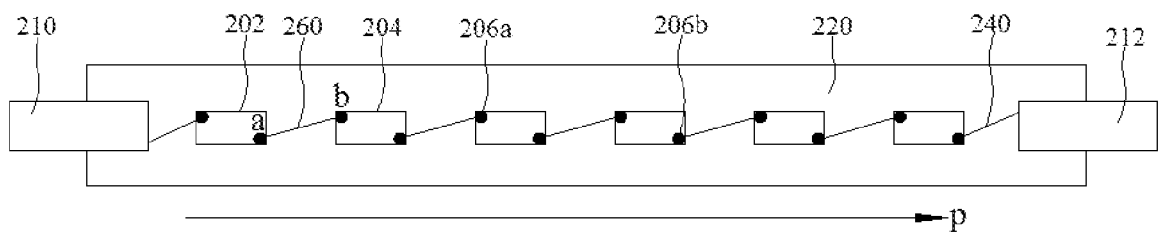
FIG. 2B is a bottom view of FIG. 2A.
Figure 2C:
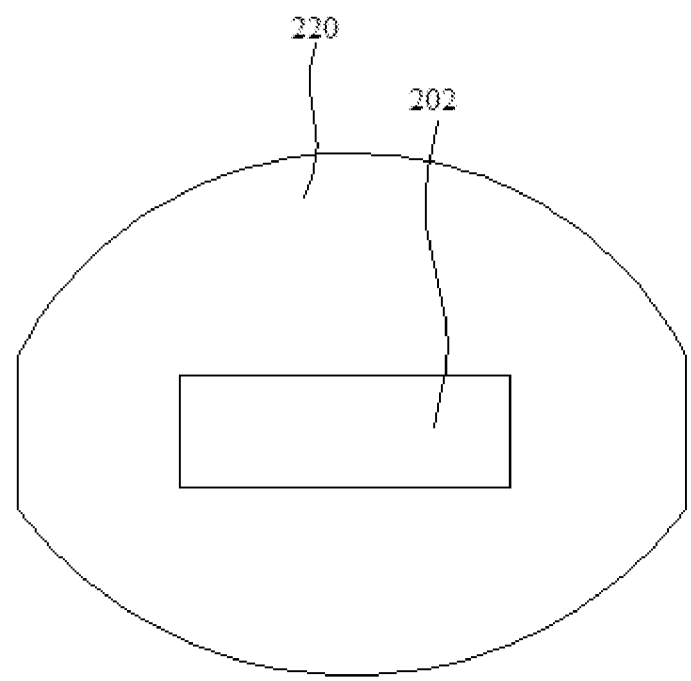
FIG. 2C is a schematic partial cross-sectional view of a position A-A in FIG. 2A.

Still referring to FIG. 2A to FIG. 2C, FIG. 2A is a schematic three-dimensional partial cross-sectional view of an embodiment of an LED filament according to this application, FIG. 2B is a bottom view of FIG. 2A, and FIG. 2C is a schematic partial cross-sectional view of a position A-A in FIG. 2A. An LED filament 300 includes a plurality of LED chip units 202, 204, at least two conductive electrodes 210, 212, and a light conversion layer 220. The LED chip units 202, 204 are electrically connected to each other. The conductive electrodes 210, 212 are configured corresponding to the LED chip units 202, 204 and are electrically connected to the LED chip units 202, 204 by first conductive portions 240. The light conversion layer 220 wraps the LED chip units 202, 204 and the conductive electrodes 210, 212, and exposes at least parts of the two conductive electrodes 210, 212. The light conversion layer 220 includes silica glue, phosphor, and heat dissipation particles. In some embodiments, the LED chip unit 202/204 includes at least one LED chip. The concentration of phosphor corresponding to each surface of the LED chip is the same, so that the light conversion rate of each surface is the same, and the light uniformity of the LED filament is good.

The LED chip unit 202/204 includes at least one LED chip, and the LED chip unit 202/204 has a first electrical connecting portion 206a and a second electrical connecting portion 206b. In the length direction of the LED filament, the distance between first connecting portions 206a of two adjacent LED chip units is greater than the distance between the two adjacent LED chip units. In some embodiments, in the length direction of the LED filament, the distance between the first connecting portion 206a and the second connecting portion 206b of two adjacent LED chip units 202, 204 is greater than the distance between the two adjacent LED chip units 202, 204, and at least a part of the first electrical connecting portion 206a and the second electrical connecting portion 206b is in contact with the light conversion layer 220. The first electrical connecting portion 206a and the second electrical connecting portion 206b are located on the same side of the LED chip unit 202/204.

In one embodiment, the second electrical connecting portion 206b of the LED chip unit 202 is electrically connected to the first electrical connecting portion 206a of the LED chip unit 204. For example, the second electrical connecting portion 206b of the LED chip unit 202 may be electrically connected to the first electrical connecting portion 206a of the LED chip unit 204 by the second conductive portion 260. The second conductive portion 260 has an end point a and an end point b, a line connecting the end point a and the end point b forms a straight line ab, and the straight line ab intersects the length direction p of the LED filament. In some embodiments, the light conversion layer 220 includes a top layer and a carrying layer (not shown). The top layer wraps the LED chip units 202, 204 and the conductive electrodes 210, 212, and exposes at least parts of the two conductive electrodes 210, 212. The carrying layer includes a base layer. The base layer includes an upper surface and a lower surface opposite to the upper surface. The upper surface of the base layer is close to the top layer relative to the lower surface of the base layer. At least one of the first conductive portion 240 and the second conductive portion 260 is in contact (direct contact or indirect contact) with the upper surface of the base layer. When the LED filament is bent, the curvature radius of the base layer after being bent under force is relatively small, and the first conductive portion and the second conductive portion are not prone to be broken. In one embodiment, the first electrical connecting portion 206a and the second electrical connecting portion 206b are in contact (direct contact or indirect contact) with the upper surface of the base layer. The LED chip unit may be a flip chip or a mini LED chip. The mini LED refers to an LED with a package size of 0.1-0.2 mm, also referred to as the mini light emitting diode. When the LED chip unit is electrically connected, for example, the second electrical connecting portion 206b of the LED chip unit 202 may be a positive connection point, and the first electrical connecting portion 206a of the LED chip unit 204 may be a negative connection point, the second electrical connecting portion 206b of the LED chip unit 202 is electrically connected to the first electrical connecting portion 206a of the LED chip unit 204 by the second conductive portion 260. In another example, the second electrical connecting portion 206b of the LED chip unit 202 may be a negative connection point, and the first electrical connecting portion 206a of the LED chip unit 204 may be a positive connection point, the second electrical connecting portion 206b of the LED chip unit 202 is electrically connected to the first electrical connecting portion 206a of the LED chip unit 204 by the second conductive portion 260. The first conductive portion 240 and the second conductive portion 260 may be in the form of wires or films, such as copper wires, gold wires, circuit films, or copper foil.

Figure 3A:
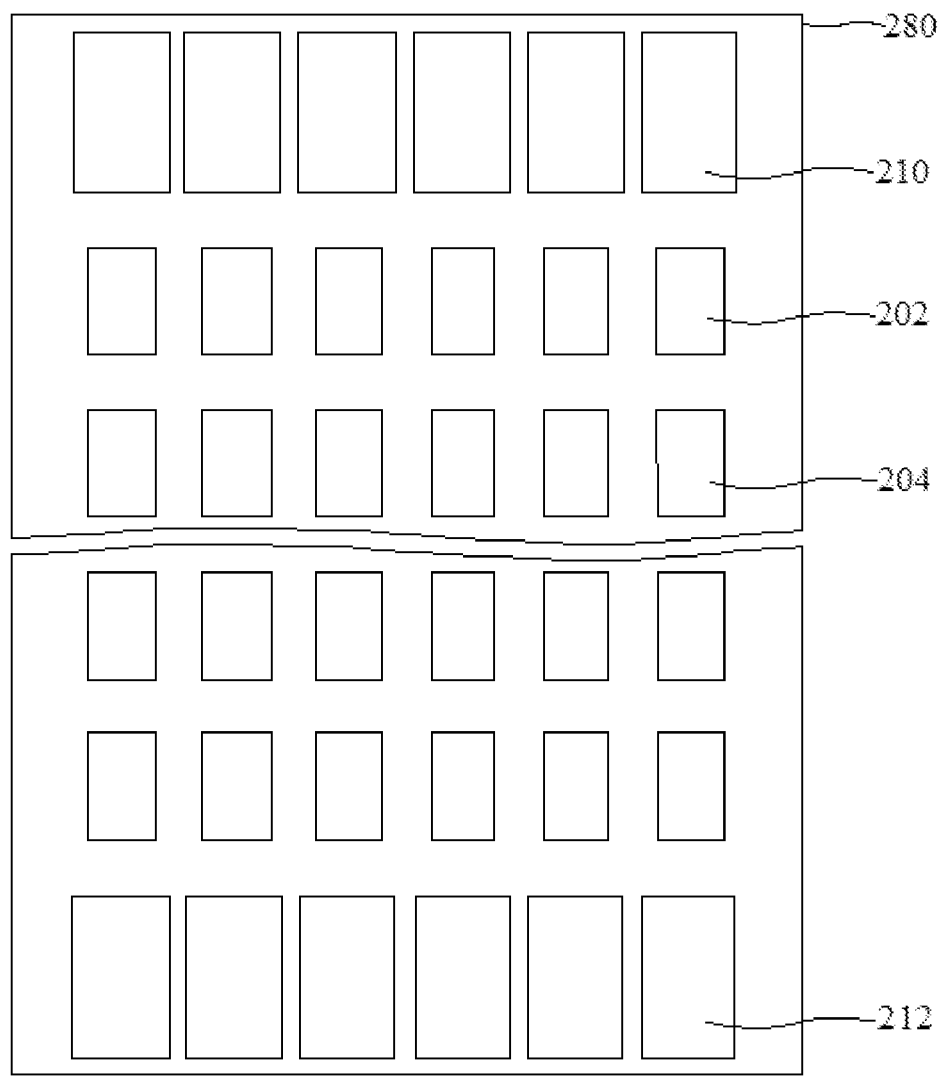
FIG. 3A to FIG. 3E are schematic diagrams of a first embodiment of a method for manufacturing an LED filament according to this application.

FIG. 3A to FIG. 3E are schematic diagrams of one embodiment of a method for manufacturing an LED filament according to this application. The method for manufacturing an LED filament includes the following steps:

S20. Lay LED chip units 202, 204 and conductive electrodes 210, 212 on a carrier 280 (as shown in FIG. 3A).

Figure 3B:
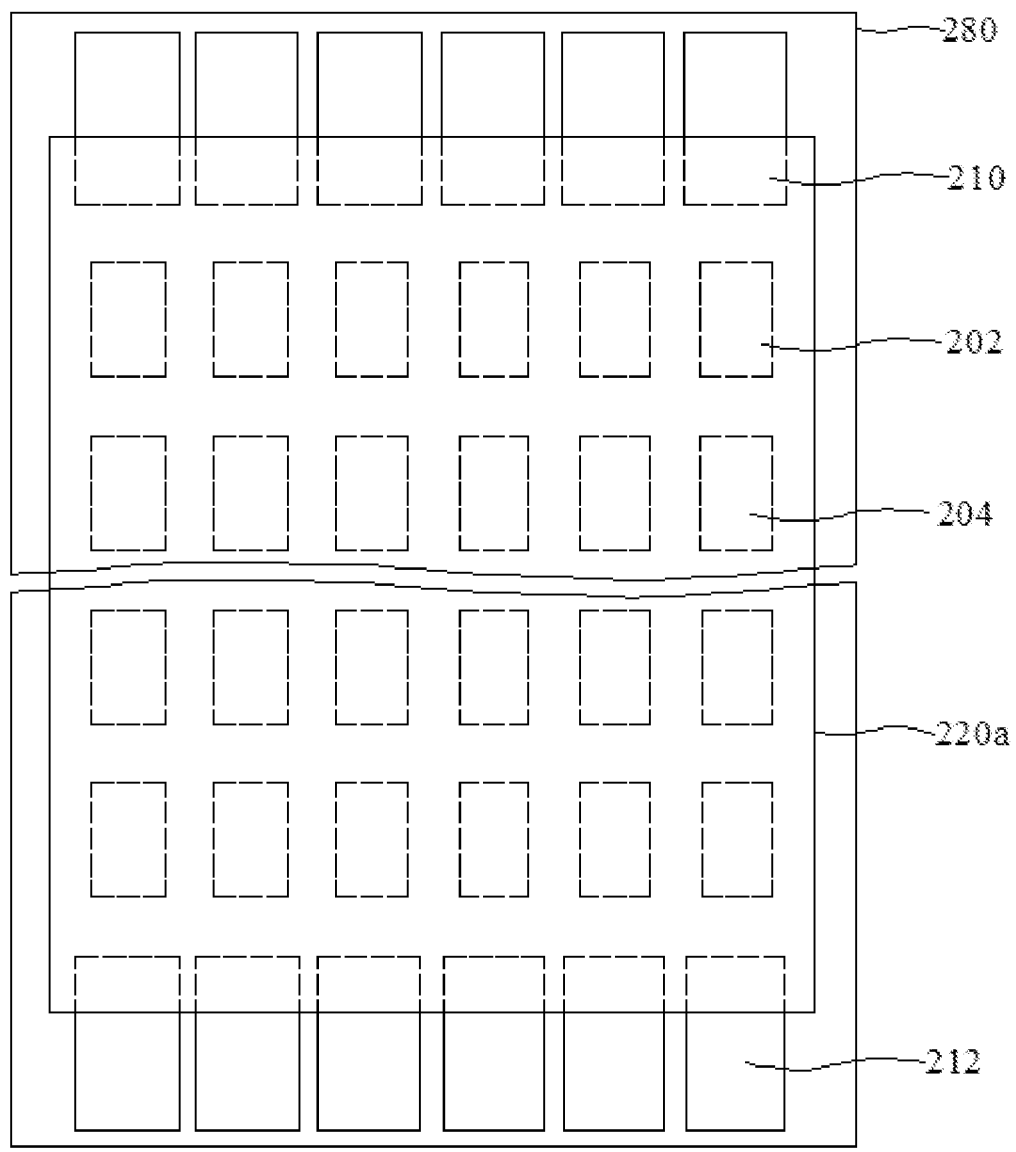

S22A. Coat the portion where the LED chip units 202, 204 and the conductive electrodes 210, 212 are not in contact with the carrier 280 with a top layer 220a, and then cure (or solidify) the LED chip units 202, 204 and the conductive electrodes 210, 212 that are coated with the top layer 220a, so that the top layer 220a is cured and covers the LED chip units 202, 204 and the conductive electrodes 210, 212 on the carrier, and at least parts of the two conductive electrodes 210, 212 are exposed (as shown in FIG. 3B). The curing procedure is, for example, but not limited to, heating or ultraviolet (UV) irradiation.

S22B. There are several ways to flip the LED chip units 202, 204 and the conductive electrodes 210, 212 that are coated with the top layer 220a, one is that the LED chip units 202, 204 and the conductive electrodes 210, 212 are only disposed on the carrier 280 with no adhesion therebetween and therefore can be flipped directly, and the flipped semi-finished product may be laid on the carrier 280.

The other is that, if there is a glue-like substance, such as a photoresist used in a semiconductor process or easy-to-remove die-bonding glue, for adhesion between the carrier 280 and the LED chip units 202, 204 and the conductive electrodes 210, 212, after being properly baked, the glue-like substance has the effect of temporarily fixing the LED chip units 202, 204 and the conductive electrodes 210, 212 on the carrier 280. Therefore, before or after the LED chip units 202, 204 and the conductive electrodes 210, 212 that are coated with the top layer 220a are flipped, the photoresist coated on the carrier 280 may be cleaned with acetone, or the die-bonding glue on the carrier may be removed with a corresponding solvent, so that the LED chip units 202, 204 and the conductive electrodes 210, 212 that are coated with the top layer 220a can be separated from the carrier 280. In addition, washing may be further performed to remove residual photoresist or die-bonding glue.

Figure 3C:
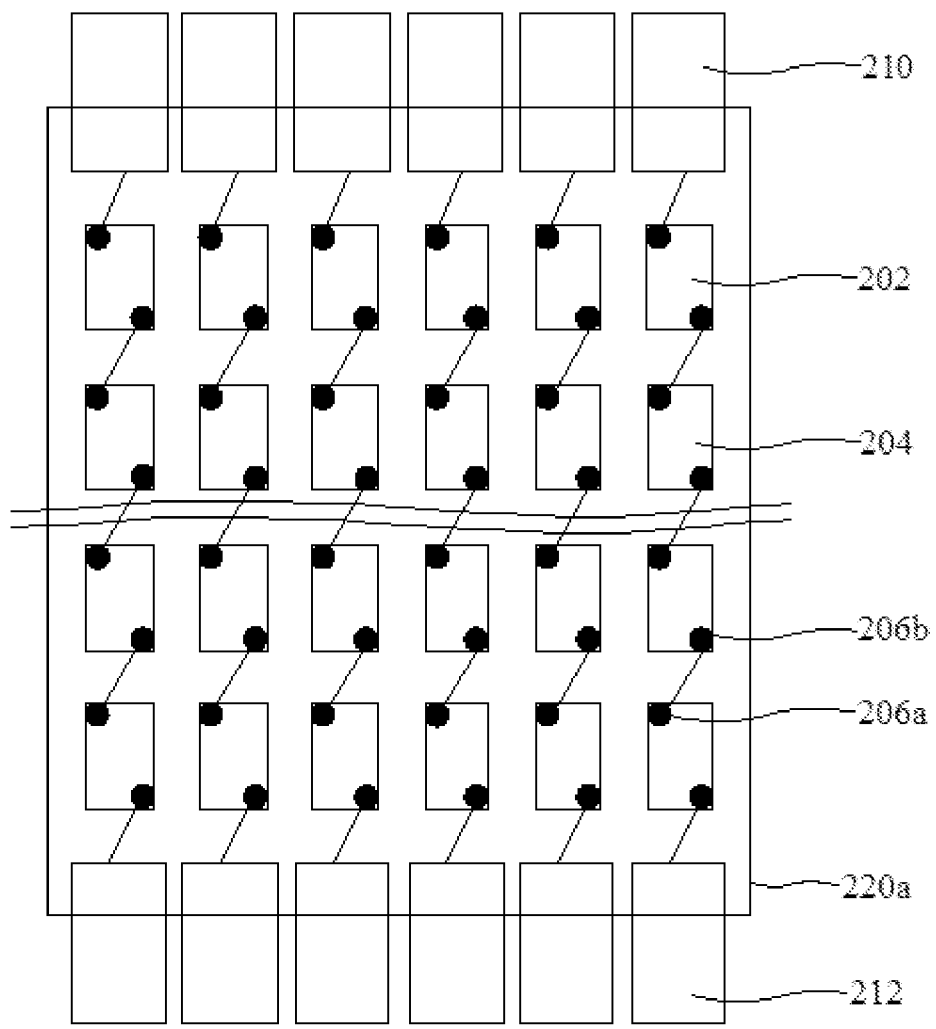

S24. Electrically connect adjacent LED chip units 202, 204, and the LED chip units 202/204 with the conductive electrodes 210, 212 (as shown in FIG. 3C).

Figure 3D:
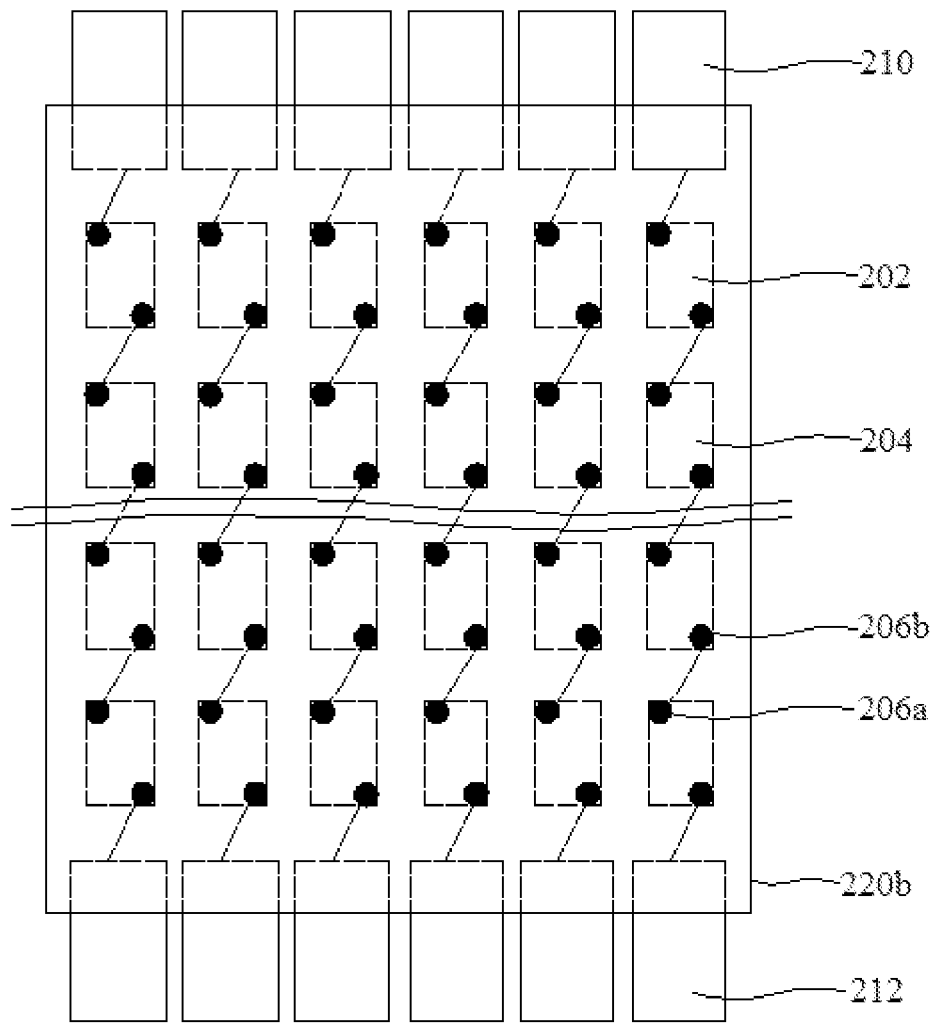

S26. After step S24, coat the portion where the LED chip units 202, 204 and the conductive electrodes 210, 212 are not coated with the top layer 220a with a base layer 220b, and perform curing after the coating is completed (as shown in FIG. 3D).

Figure 3E:
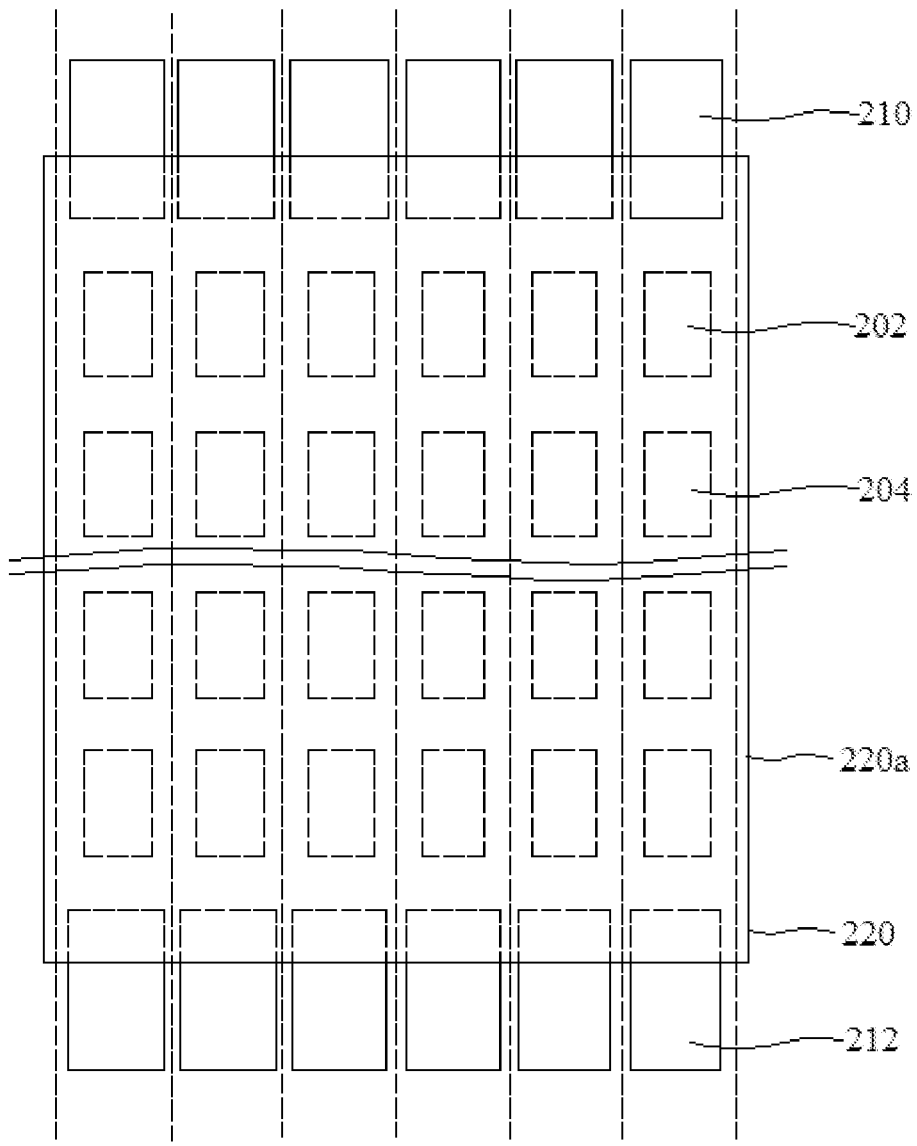

After step S26, another step S28 of cutting the LED chip units 202, 204 and the conductive electrodes 210, 212 that are wrapped with a light conversion layer 220 as cutting positions shown by dashed lines in FIG. 3E may be included. In this way, a strip-shaped element after cutting is the LED filament 300. The cutting method of step S28 is not limited to FIG. 3E, and every two adjacent columns of LED chip units 202, 204 may be cut into a single LED filament.

In the method for manufacturing an LED filament in this embodiment, the top layer 220a and the base layer 220b may be made of phosphor and silica glue in the same proportion. If the top layer 220a and the base layer 220b further contain oxidized nanoparticles, the proportions of phosphor, silica glue, and oxidized nanoparticles in the top layer 220a and the base layer 220b are the same. In other words, the materials of the top layer 220a and the base layer 220b are the same, and the top layer 220a and the base layer 220b are distinguished only for the convenience of description. Certainly, in other embodiments, the proportions of phosphor, silica glue, and oxidized nanoparticles in the top layer 220a and the base layer 220b may be different.

In one embodiment, the above mentioned base layer 220b contains organosilicon-modified polyimide, a thermal curing agent, which is epoxy resin, isocyanate, or bisoxazoline compound, heat dissipation particles, and phosphor, the heat dissipation particles include silicon dioxide ($SiO_2$), aluminum oxide ($Al_2O_3$) and zirconium oxide ($ZrO_2$), etc. In one embodiment, based on the weight of the organosilicon-modified polyimide, the amount of the thermal curing agent is 3-12% of the weight of the organosilicon-modified polyimide. The organosilicon-modified polyimide includes a repeating unit represented by the following general formula (I):

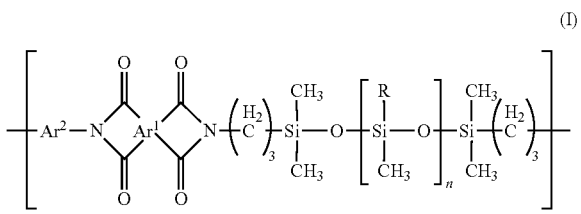

In the general formula (I), $Ar^1$ is a tetravalent organic group. The organic group has a benzene ring or an alicyclic hydrocarbon structure. The alicyclic hydrocarbon structure may be a monocyclic alicyclic hydrocarbon structure, or may have an alicyclic hydrocarbon structure containing a bridged ring, which may be a bicyclic alicyclic hydrocarbon structure or a tricyclic alicyclic hydrocarbon structure. The organic group may alternatively be a benzene-ring structure or an alicyclic hydrocarbon structure containing an active hydrogen functional group, wherein the active hydrogen functional group is any one or more of a hydroxy group, an amino group, a carboxyl group, an amido group, or a thiol group.

$Ar^2$ is a divalent organic group. The organic group may have, for example, a monocyclic alicyclic hydrocarbon structure, or may be a divalent organic group containing an active hydrogen functional group, wherein the active hydrogen functional group is any one or more of a hydroxy group, an amino group, a carboxyl group, an amido group, or a thiol group.

R is independently selected from methyl or phenyl.

n is 1-5, preferably 1, 2, 3, or 5.

The polymer of the general formula (I) has a number average molecular weight of 5,000-100,000, preferably 10,000-60,000, more preferably 20,000-40,000. The number average molecular weight is determined by gel permeation chromatography (GPC) and calculated based on a calibration curve obtained by using standard polystyrene. When the number average molecular weight is below 5,000, good mechanical properties are hard to be obtained after curing, especially the elongation tends to decrease. On the other hand, when the number average molecular weight exceeds 100,000, the viscosity becomes excessively high, making the resin hard to form.

$Ar^1$ is a component derived from a dianhydride, which may include an aromatic anhydride and an aliphatic anhydride. The aromatic anhydride includes an aromatic anhydride containing only a benzene ring, a fluorinated aromatic anhydride, an aromatic anhydride containing an amido group, an aromatic anhydride containing an ester group, an aromatic anhydride containing an ether group, an aromatic anhydride containing a sulfide group, an aromatic anhydride containing a sulfonyl group, and an aromatic anhydride containing a carbonyl group.

$Ar^2$ is a component derived from a diamine, which may include an aromatic diamine and an aliphatic diamine. The aromatic diamine includes an aromatic diamine containing only a benzene ring, a fluorinated aromatic diamine, an aromatic diamine containing an ester group, an aromatic diamine containing an ether group, an aromatic diamine containing an amido group, an aromatic diamine containing a carbonyl group, an aromatic diamine containing a hydroxyl group, an aromatic diamine containing a carboxy group, an aromatic diamine containing a sulfonyl group, and an aromatic diamine containing a sulfide group.

Adding different thermal curing agents imposes different effects on the light transmittance of the organosilicon-modified polyimide.

Even if the same thermal curing agent is added, different added amounts have different effects on the light transmittance. Table 1-1 shows that, when the added amount of the thermal curing agent BPA into the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to a certain degree, adding more thermal curing agent has a limited effect on the light transmittance.

TABLE 1-1

| Organosilicon-modified polyimide | Thermal curing agent Type | Added amount (%) | Light transmittance (%) 380 nm | 410 nm | 450 nm | Thickness of film (μm) | Elongation (%) | Tensile strength (MPa) |
|---|---|---|---|---|---|---|---|---|
| Full aliphatic | BPA | 4.0 | 86.2 | 88.4 | 89.7 | 44 | 22.5 | 9.8 |
| Full aliphatic | | 8.0 | 87.1 | 89.1 | 90.6 | 44 | 24.4 | 10.5 |
| Full aliphatic | | 12.0 | 87.3 | 88.9 | 90.5 | 44 | 20.1 | 9.0 |

A phosphor composition as a part of the top layer 420b includes a first phosphor with a peak wavelength at 490-500 nm and a full width at half maximum (FWHM) of 29-32 nm under blue light excitation, a second phosphor with a peak wavelength at 520-540 nm and a FWHM of 110-115 nm under blue light excitation, a third phosphor with a peak wavelength at 660-672 nm and a FWHM of 15-18 nm under blue light excitation, and a fourth phosphor with a peak wavelength at 600-612 nm and a FWHM of 72-75 nm, or with a peak wavelength at 620-628 nm and a FWHM of 16-18 nm, or with a peak wavelength at 640-650 nm and a FWHM of 85-90 nm under blue light excitations. The median particle diameter (D50) of any one of the first phosphor, the second phosphor, the third phosphor, and the fourth phosphor ranges from 15 μm to 20 μm. The range of D50 of the second phosphor and the third phosphor is preferably 15-16 μm. The range of D50 of the first phosphor and the fourth phosphor is preferably 16-20 μm. When the phosphor is excited by blue light, the different thicknesses of the top layer with consistent phosphor concentration will affect the FWHM of the phosphor. In this embodiment, the thickness of the top layer 420b is 80-100 μm. The weight percentage of each phosphor in the phosphor composition is as follows: the first phosphor is 5.45-5.55%, the second phosphor is 70-88%, the third phosphor is 0.6-7%, and the fourth phosphor is the remaining. The phosphor is mixed under a certain ratio of phosphor to glue. Phosphors with different peak wavelengths are selected, and under the conditions of a blue LED chip with a wavelength peak of 451 nm and an FWHM of 16.3 nm, and a current of 30 mA, the results of light performance of different phosphor compositions are shown in Table 1:

TABLE 1

| | Content (%) | | | | | | | | | |
|---|---|---|---|---|---|---|---|---|---|---|
| | First | Second | Third | Fourth phosphor | | Proportion of total phosphor | | | | |
| No. | phosphor 495 nm | phosphor 535 nm | phosphor 670 nm | 630 nm | 652 nm | to glue (%) | Eff (lm/w) | Ra | R9 | CCT (K) |
| 1 | 5.49 | 72.55 | 0.83 | | 21.13 | 27.4 | 103.5 | 94.7 | 93.0 | 2641 |
| 2 | 5.49 | 72.55 | 2.54 | | 15.45 | 27.4 | 107.0 | 92.8 | 81.9 | 2683 |
| 3 | 5.51 | 85.83 | 5.04 | 3.62 | | 27.6 | 102.0 | 97.0 | 91.5 | 2621 |
| 4 | 5.51 | 85.83 | 4.63 | 3.59 | | 27.6 | 106.8 | 97.1 | 84.9 | 2670 |

It can be learned from top layers No. 1 to No. 4 in Table 1 that the content of the third phosphor and the fourth phosphor in the phosphor composition affects the luminous efficiency (Eff), average color rendering index (Ra), and saturated red color (R9). It can be learned from compositions No. 1 and No. 2 that, when the content of the fourth phosphor with a peak wavelength at 670 nm increases, the Eff will increase, but Ra and R9 will decrease. When the phosphor with a peak wavelength at 652 nm is replaced with the phosphor with a peak wavelength at 630 nm, it can be learned from No. 3 and No. 4 in Table 1 that, when the content of the fourth phosphor with a peak wavelength at 670 nm increases, the Eff will decrease, but Ra and R9 will increase. Therefore, when the fourth phosphor with different wavelength peaks is selected, the amount of the third phosphor and the fourth phosphor may be adjusted according to actual needs to obtain relatively good luminous performance.

Ratio Between Phosphor and Glue

As shown in Table 2, the same phosphor is used, and the ratio of phosphor composition to glue is adjusted. It can be seen from Table 2 that different ratios of phosphor composition to glue result in different Eff, Ra, R9, and Correlated Color Temperature (CCT), and as the ratio of phosphor composition to glue increases, Eff, Ra, and CCT decrease, and R9 first decreases and then increases. In addition, when the phosphor composition with a glue (for example, silica glue) is used as the top layer of the LED filament, since the specific weight of the phosphor composition is greater than that of the silica glue, apparent precipitation of the phosphor will occur during the manufacturing process of the top layer, causing the white LED color temperature to drift. The more ratio of the phosphor composition to the glue, the more produced precipitation of the phosphor, resulting in a more severe color temperature drift. Therefore, the weight ratio of the phosphor composition to the glue in the top layer is 0.2-0.3:1, preferably 0.25-0.3:1. In one embodiment, a certain amount of hollow glass microbeads may be added into the phosphor composition. When the phosphor precipitates, the glass microbeads float up, and the light backscattering/emission degree decreases during floating, which offsets the effect of light scattering by phosphor settling, so that the drift in the color temperature can be alleviated. In addition, because the microbeads absorb less visible light, the addition of the glass microbeads has less effect on the initial brightness of the white light LEDs. The mass ratio of the glass microbeads to the phosphor composition is 1:5-15, and preferably the weight ratio of the glass microbeads to the phosphor composition is 1:10-15.

TABLE 2

| | | Second phosphor | | | | Proportion | | | | |
| | First phosphor | 500 | 535 | Third phosphor | Fourth phosphor | of total to glue | Eff | | | CCT |
| No. | 495 nm | nm | nm | 670 nm | 600 nm | (%) | (lm/w) | Ra | R9 | (K) |
|---|---|---|---|---|---|---|---|---|---|---|
| 1 | 4.01 | 7.12 | 77.44 | 5.20 | 6.23 | 27.2 | 102.9 | 99.0 | 98.7 | 2718 |
| 2 | 4.03 | 7.10 | 77.46 | 5.19 | 6.22 | 35.2 | 91.9 | 98.6 | 98.5 | 2342 |
| 3 | 4.02 | 7.12 | 77.47 | 5.14 | 6.25 | 40.2 | 82.2 | 97.9 | 99.0 | 2128 |

In one embodiment, an LED filament is provided, wherein the provided LED filament is made of the above-mentioned phosphor composition with a blue chip. The blue chip has a peak wavelength at 450-500 nm, and a FWHM of 15-18 nm.

In some embodiments, a phosphor composition as a part of the top layer 420b includes a first phosphor with a peak wavelength at 500-550 nm and a FWHM of 100-130 nm under blue light excitation, a second phosphor with a peak wavelength at 580-620 nm and a FWHM of 70-90 nm under blue light excitation, and a third phosphor with a peak wavelength at 620-670 nm and a FWHM of 70-95 nm under blue light excitation. The median particle diameter (D50) of any one of the first phosphor, the second phosphor, and the third phosphor ranges from 15 μm to 20 μm. The range of D50 of the first phosphor is preferably 15-16 μm. The range of D50 of the second phosphor and the third phosphor is preferably 16-20 μm. When the phosphor is excited by blue light, the different thicknesses of the top layer with consistent phosphor concentration will affect the FWHM of the phosphor. In this embodiment, the thickness of the top layer 420b is 80-100 μm. The amount of the first phosphor in the phosphor composition is less than or equal to 10 times the sum of the amounts of the second phosphor and the third phosphor, that is, the amount of the first phosphor ≤10*(the amount of the second phosphor+the amount of the third phosphor). The weight ratio of phosphor composition to glue in the top layer is 0.4-0.8:1. The closer the amount of the phosphor composition is to the amount of the silica glue, the higher the conversion efficiency of the light emitted by the LED chips is. In addition, the contact area between the phosphor and the LED chips increases, and then the heat dissipation efficiency of the heat generated by the LED chips is improved.

Figure 4A:
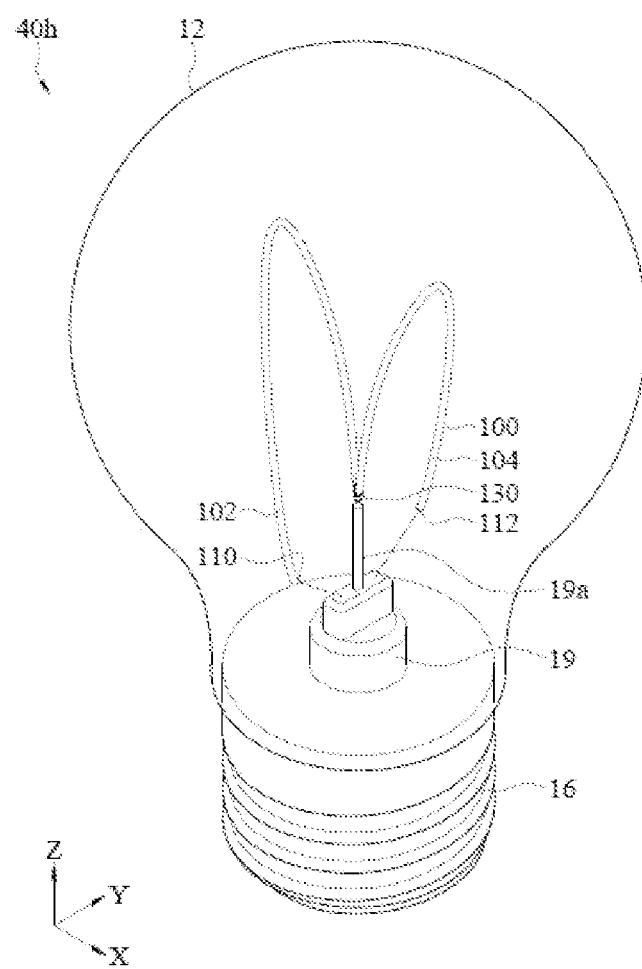
FIG. 4A to FIG. 4D are respectively a schematic diagram, a side view, another side view, and a top view of an LED light bulb according to an embodiment of this application.
Figure 4B:
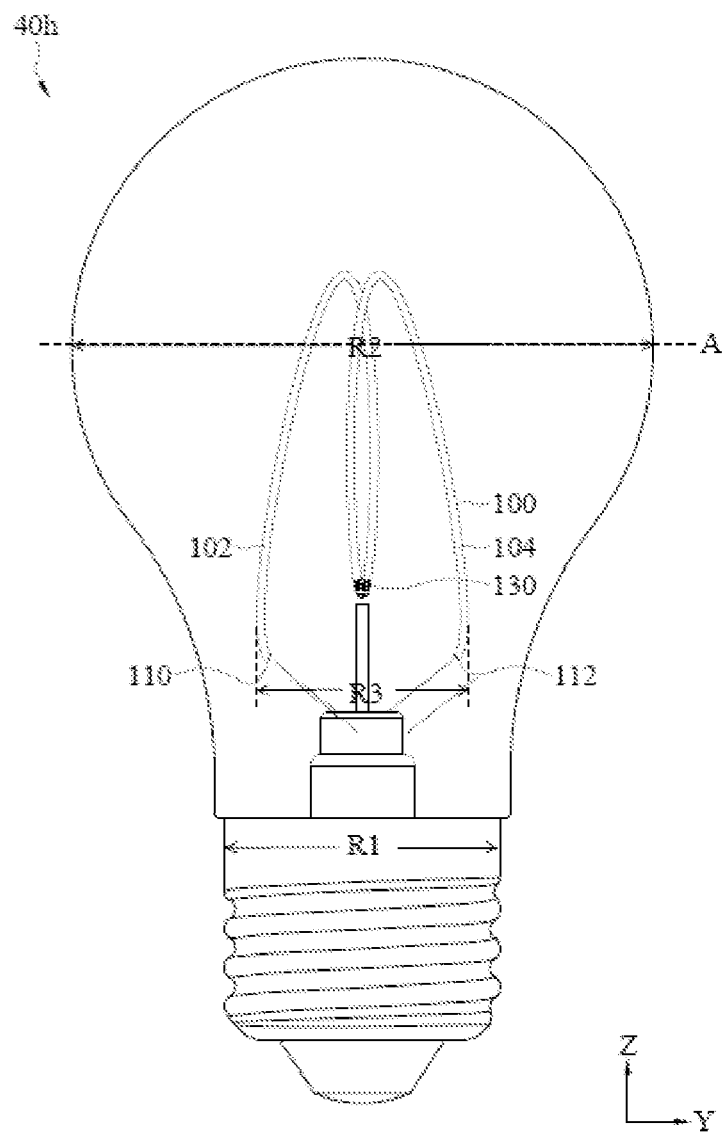
Figure 4C:
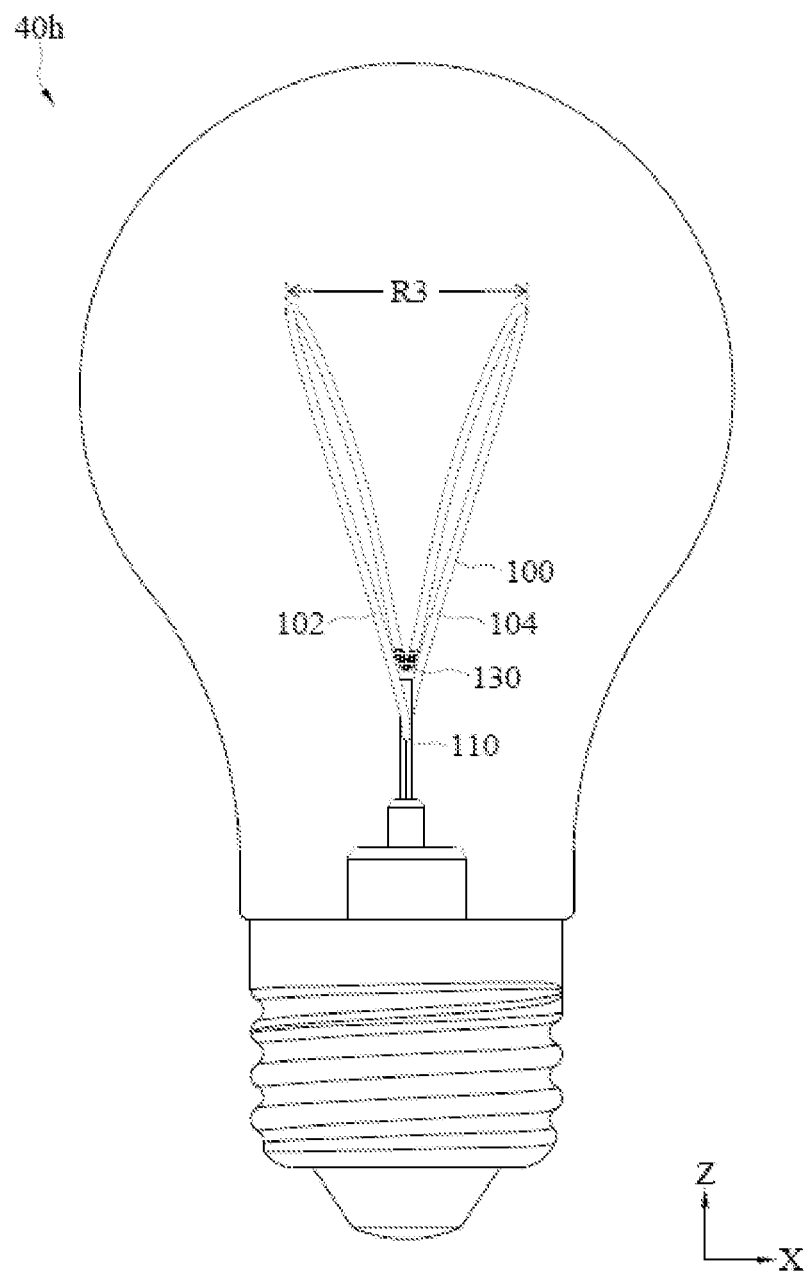
Figure 4D:
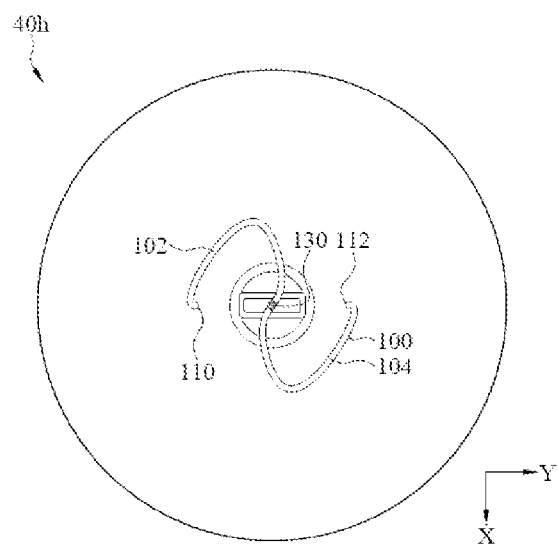

Referring to FIG. 4A to FIG. 4D, FIG. 4A is a schematic diagram of an LED light bulb 40h according to an embodiment of this application, and FIG. 4B to FIG. 4D are a side view, another side view, and a top view of the LED light bulb 40h in FIG. 4A, respectively. In this embodiment, as shown in FIG. 4A to FIG. 4D, the LED light bulb includes a lamp housing 12, a lamp cap 16 connected to the lamp housing 12, at least two conductive brackets disposed in the lamp housing 12, a supporting arm (not shown), a stem 19, and a single LED filament 100. The stem 19 includes a stem bottom portion and a stem top portion that are opposite to each other. The stem bottom portion is connected to the lamp cap 16. The stem top portion extends to the inside of the lamp housing 12, for example, the stem top portion may be located approximately at the center of the lamp housing 12. The conductive brackets are connected to the stem 19. The LED filament 100 includes a filament body and two filament electrodes (electrodes or conductive electrodes) 110, 112. The two filament electrodes 110, 112 are located at two opposite ends of the filament body. The filament body is the other portion of the LED filament 100 excluding the filament electrodes 110, 112. The two filament electrodes 110, 112 are connected to the two conductive brackets, respectively. One end of the supporting arm is connected to the stem 19, and the other end is connected to the filament body.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can pump out the air inside the lamp housing and substitute it with all nitrogen or a combination of nitrogen and helium in a proper ratio through the stem, to improve the thermal conductivity of the gas inside the lamp housing and remove water mist hidden in the air at the same time. In one embodiment, the air may alternatively be pumped out and substitute it with a combination of nitrogen and oxygen or nitrogen and air in a proper ratio. The content of oxygen or air is 1-10% of the volume of the lamp housing, preferably 1-5%. When a base layer contains saturated hydrocarbons, during the use of the LED light bulb, the saturated hydrocarbons will generate free radicals under the effect of light, heat, stress, etc. The generated free radicals or activated molecules will combine with oxygen to form peroxide free radicals. Thus, filling the lamp housing with oxygen can improve the heat and light resistance of the base layer containing the saturated hydrocarbons.

In the manufacturing process of the LED light bulb, in order to increase the refractive index of the lamp housing 12 to the light emitted by the LED filament, some foreign matter, for example, rosin, may be attached to an inner wall of the lamp housing 12. The average thickness of the foreign matter deposited per square centimeter of the inner wall area of the lamp housing 12 is 0.01-2 mm, and the thickness of the foreign matter is preferably 0.01-0.5 mm. In one embodiment, the content of the foreign matter per square centimeter of the inner wall area of the lamp housing 12 is 1-30% of the content of the foreign matter on the inner wall of the entire lamp housing 12, preferably 1-10%. For example, the content of the foreign matter may be adjusted by vacuum drying the lamp housing. In another embodiment, some impurities may be left in the gas filled in the lamp housing 12. The content of the impurities in the gas filled is 0.1-20% of the volume of the lamp housing 12, preferably 0.1-5%. For example, the content of the impurities may be adjusted, for example, by a method of vacuum drying to the lamp housing. Because the gas filled contains a small amount of impurities, the light emitted by the LED filament is emitted or refracted by the impurities to increase a luminous angle, which is beneficial to improving the luminous effect of the LED filament.

A Cartesian coordinate system having an X-axis, a Y-axis and a Z-axis is oriented for the LED light bulb, where the Z-axis is parallel to the stem 19, and the total length of the projection of the LED filament 100 on the XY plane, YZ plane and XZ plane is respectively the length L1, length L2, and length L3. In the present embodiment, the length L1, the length L2, and the length L3 are approximately in a ratio of 0.8:1:0.9. In some embodiments, the length L1, the length L2, and the length L3 are approximately in a ratio of (0.5 to 0.9):1:(0.6 to 1), the ratio of the length L1, the length L2, and the length L3 is closer to 1:1:1, the illumination uniformity of the LED filament 100 in the LED light bulb 40a is better, and the omni-directional light appearance is better. The LED filament 100 has at least one first bending point and at least two second bending points when the LED filament is bent. The at least one first bending point and the at least two second bending points are arranged alternately, and the height of any one of the at least one first bending point on the Z-axis is greater than that of any one of the at least two second bending points. In one embodiment, the distances between any of two adjacent first bending points on the Y-axis and the X-axis are equal, and the LED filament has a neat and beautiful appearance. In one embodiment, a distance between any of two adjacent first bending points on the Y-axis or the X-axis has a maximum value D1 and a minimum value D2, where the range of D2 is from 0.5D1 to 0.9D1, and the luminous flux distribution on each plane is relatively consistent. Assuming that a diameter of the lamp cap 16 is R1 (referring to FIG. 4B), a maximum diameter of the lamp housing 12 or a maximum horizontal spacing of the lamp housing 12 in the YZ-plane is R2 (referring to FIG. 4B), a maximum width in the Y-axis direction on the YZ-plane (referring to FIG. 4B) or a maximum width in the X-axis direction on the XZ-plane (referring to FIG. 4C) of the LED filament 100 is R3, then R3 is between R1 and R2, that is, R1<R3<R2. When the LED filament is bent, the distance between adjacent first bending points and/or adjacent second bending points in the Z-axis direction is wide, which is beneficial to improving the heat dissipation effect of the LED filament. In the manufacturing process of the LED light bulb, the LED filament 100 may be placed into an inner space of the lamp housing 12 in a manner of folding first, and then the LED filament 100 may be stretched in the lamp housing 12 manually or mechanically, so that a maximum length of the LED filament 100 on the XZ-plane satisfies the above-mentioned relationship.

As shown in FIG. 4A to FIG. 4D, in this embodiment, the LED filament 100 has one conductive section 130 and two LED sections 102, 104, and every two adjacent LED sections 102, 104 are connected to each other by the conductive section 130. The bent portion of the LED filament 100 at the highest point has an arc shape, that is, the LED sections 102, 104 respectively has an arc shape at the highest point of the LED filament 100, and the conductive section 130 shows an arc shape at a low point of the LED filament 100 as well. The LED filament 100 may be configured to have a structure where each bent conductive section 130 is followed by one segment, and each LED section 102, 104 is formed into a respective section.

Moreover, since the base layer as a flexible substrate (preferably made of a silicone-modified polyimide resin composition) is adopted by the LED filament 100, the silicone-modified polyimide resin composition includes organosilicon-modified polyimide, a thermal curing agent, heat dissipation particles, and phosphor. In this embodiment, two LED sections 102, 104 are respectively bent to form an inverted U shape, the conductive section 130 is located between the two LED sections 102, 104 and the bending degree of the conductive section 130 is the same as or greater than that of the LED sections 102/104. That is, the two LED sections 102, 104 are respectively bent at a high point of the LED filament to form an inverted U shape and have a bending radius r1, the conductive section 130 is bent at a low point of the LED filament 100 and has a bending radius r2, and r1 is greater than r2. Through the configuration of the conductive section 130, the LED filament 100 can be bent with a small radius of gyration in a limited space. In one embodiment, the bending points of the LED section 102 and the LED section 104 are at the same height in the Z direction, the LED filament 100 has a certain symmetry in some directions, so the light distribution of the LED light bulb may be more uniform. In one embodiment, the bending points of the LED section 102 and the LED section 104 are at different height in the Z direction, the height of the bending points of the LED section 102 is greater than that the bending points of the LED section 104, in the case of the same LED filament length, when the LED filament is placed in the lamp housing in this way, part of the LED filament will be more biased towards the lamp housing, so the heat dissipation of the LED filament is better. In addition, in the Z direction, a stand 19a of this embodiment has a smaller height than a stand 19a of the previous embodiment, and the height of the stand 19a of this embodiment corresponds to the height of the conductive section 130 or the stand 19a is presumably in contact with part of the conductor section 130. For example, the lowest portion of the conductive section 130 may be connected to the top portion of the stand 19a, so that the overall shape of the LED filament 100 is not easily deformed. In different embodiments, the conductive section 130 may pass through a through hole of the top portion of the stand 19a to be connected to the stand 19a, or the conductive section 130 may be attached to the top portion of the stand 19a to be connected to the stand 19a, but it is not limited thereto. In one embodiment, the conductive section 130 may be connected to the stand 19a by a conductive wire, for example, the conductive wire is extended from the top portion of the stand 19a and connected to the conductive section 130.

As shown in FIG. 4B, in this embodiment, in the Z direction, the height of the conductive section 130 is greater than that of the two electrodes 110, 112. The two LED sections 102 may be seen as the two electrodes 110 and 112 extending upward to the highest point respectively and then bending down and further extending to connect to the conductive section 130. As shown in FIG. 4C, in this embodiment, the outline of the LED filament 100 in the XZ-plane is similar to a V shape, that is, the two LED sections 102, 104 respectively extend upward and outward obliquely, and respectively extend downward and inward obliquely to the conductive section 130 after being bent at the highest points. As shown in FIG. 4D, in this embodiment, the outline of the LED filament 100 in the XY-plane has an S shape. As shown in FIG. 4B and FIG. 4D, in this embodiment, the conductive section 130 is located between the electrodes 110, 112. As shown in FIG. 4D, in this embodiment, in the XY-plane, the bending point of the LED section 102, the bending point of the LED section 104, and the electrodes 110, 112 are substantially located on a circumference of a circle taking the conductive section 130 (or the stem 19 or the stand 19a) as a center. For example, in the XY-plane, the bending point of the LED section 102 and the bending point of the LED section 104 are located on the same circumference of a circle taking the stem 19 or the stand 19a as a center. In some embodiments, in the XY-plane, the bending point of the LED section 102, the bending point of the LED section 104, and the electrodes 110, 112 are located on the same circumference of a circle taking the stem 19 or the stand 19a as a center.

Figure 5:
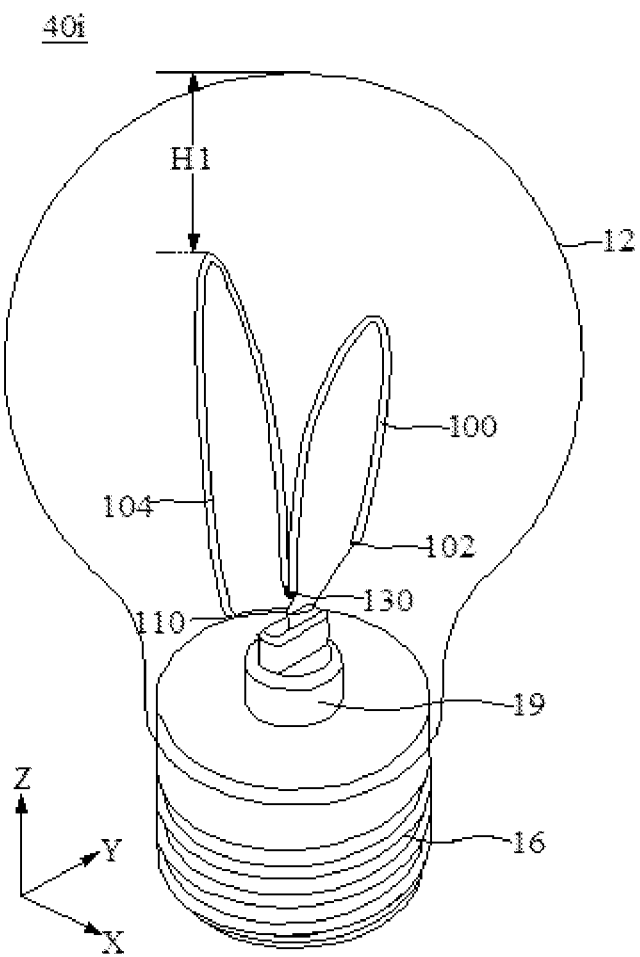
FIG. 5 is a schematic diagram of an LED light bulb according to an embodiment of this application.

Referring to FIG. 5, FIG. 5 is a schematic diagram of an LED light bulb 40i according to an embodiment of this application. The LED light bulb 40i in this embodiment has the same basic structure as the LED light bulb 40h in FIG. 4, including a lamp housing 12, a lamp cap 16 connected to the lamp housing 12, at least two conductive brackets disposed in the lamp housing 12, a supporting arm (not shown), a stem 19, and a single LED filament 100. The difference is that the LED light bulb 40i in this embodiment does not have a stand 19a. The stem 19 includes an inflation pipe, and the gas in the lamp housing 12 is filled through the inflation pipe. As shown in FIG. 5, in the Z-axis direction, the shortest distance from the LED filament 100 (or the bending point of the LED section 102/104) to the lamp housing 12 is H1, the shortest distance from the conductive section 130 to the stem 19 of the LED filament 100 is H2, and H1 is less than or equal to H2, the bending point of the LED section 102/104 is closer to the lamp housing, so the heat dissipation path of the LED filament is short, thereby improving the heat dissipation effect of the LED light bulb. In one embodiment, H1 is greater than H2, the LED filament is approximately located in the middle area of the lamp housing, and the luminous effect of the light bulb is better.

Figure 6A:
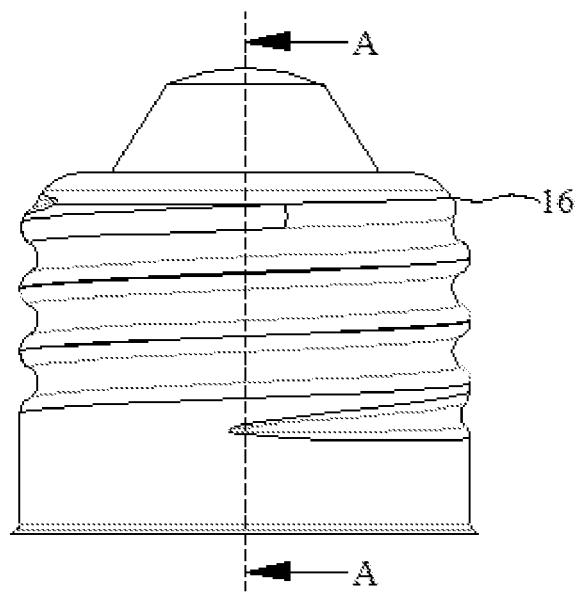
FIG. 6A is a schematic diagram of a lamp cap according to an embodiment of this application.
Figure 6B:
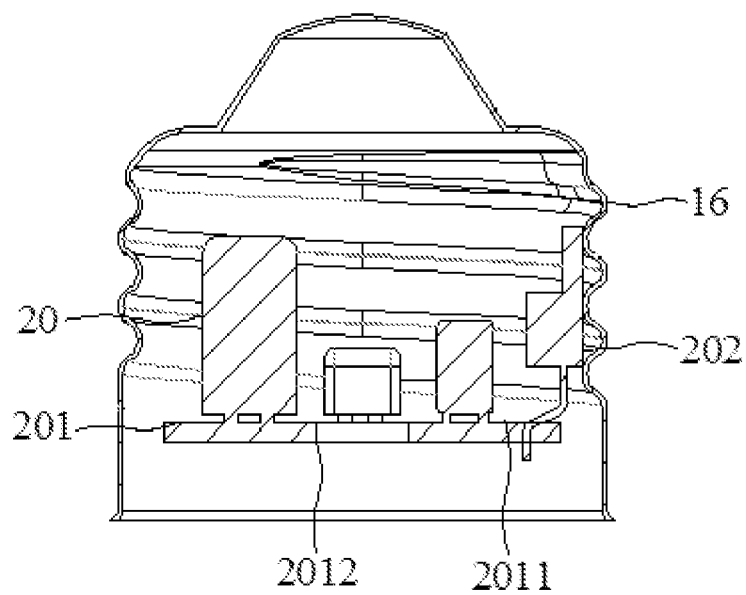
FIG. 6B is a schematic diagram of a cross section A-A in FIG. 6A.

Referring to FIG. 6, FIG. 6 is a schematic structural diagram of a lamp cap according to an embodiment of this application. In this embodiment, a power component 20 is disposed in a lamp cap 16, the power component 20 includes a substrate 201, a heating element (an element that generates more heat during operation, such as an IC or a resistor) and a non-heat-resistant element (such as an electrolytic capacitor) are disposed on the substrate 201, the lamp cap 16 has an inner surface and an outer surface opposite to the inner surface, the outer surface of the lamp cap 16 is away from the power component 20, the heating element is closer to the inner surface of the lamp cap 16 than the non-heat-resistant element, an insulation sheet 202 is disposed on the heating element, and the insulation sheet 202 is in contact with the inner surface of the lamp cap 16, for example, the insulation sheet 202 may be in contact with the inner surface of the lamp cap 16 by welding or using fasteners. In one embodiment, the heating element is integrally encapsulated into a component, a heat dissipation sheet is disposed on the component, and the heat dissipation sheet is in contact with the inner surface of the lamp cap 16. For example, after an IC and a rectifier bridge are encapsulated into a component, the heat dissipation sheet is in contact with the inner surface of the lamp cap 16 by welding or using fasteners, and the heat dissipation sheet may be welded to the inner surface of the lamp cap 16 as a negative wire.

In another embodiment, the substrate 201 is in direct contact with the inner surface of the lamp cap 16. Compared with the indirect contact between the substrate and the lamp cap through glue, the direct contact can improve the heat dissipation effect of the light bulb based on the reduction of heat transfer media.

In another embodiment, the heating element is covered with a heat conduction glue. For example, the substrate 201 has a first surface 2011 and a second surface 2012, the second surface 2012 is away from the LED filament, the heating element and the non-heat-resistant element are respectively located on the first surface 2011 and the second surface 2012, and the first surface 2011 is covered with the heat conduction glue, the heat generated by the heating element may be transferred to the lamp cap 16 through the heat conduction glue, thereby improving the heat dissipation effect of the LED light bulb.

Figure 7A:
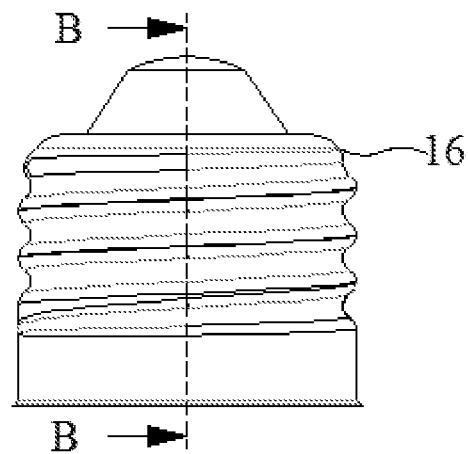
FIG. 7A is a schematic diagram of a lamp cap according to an embodiment of this application.
Figure 7B:
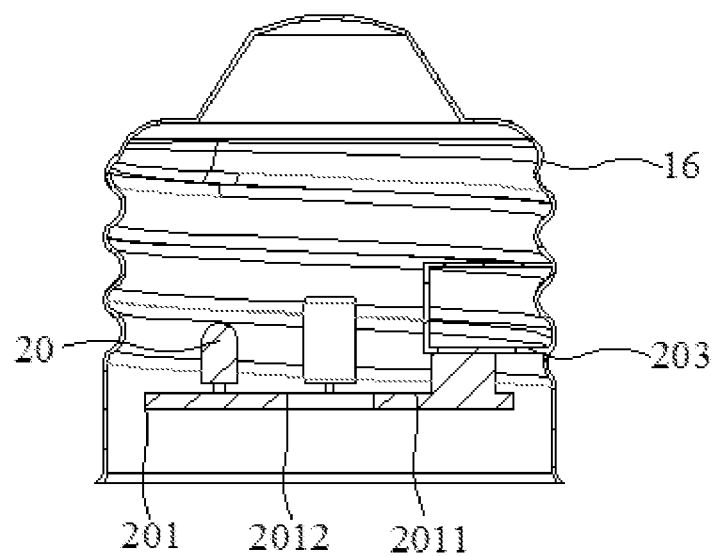
FIG. 7B is a schematic diagram of an embodiment of a cross section B-B in FIG. 7A.

In another embodiment, as shown in FIG. 7, a heat conduction portion 203 is disposed on the inner surface of the lamp cap 16, the heat conduction portion 203 may be a net bag accommodating the heating element or a metal member in contact with the heating element, the thermal conductivity of the heat conduction portion 203 is greater than or equal to the thermal conductivity of the lamp cap 16, and the heat generated by the heating element may be quickly transferred to the lamp cap 16 through the heat conduction portion 203, thereby improving the heat dissipation effect of the LED light bulb.

In another embodiment, each surface of the power component 20 is covered with the heat conduction glue, and a part of the heat conduction glue is in contact with the inner surface of the lamp cap 16. For example, a flexible substrate may be used to be integrally mounted in the lamp cap 16 by pouring the heat conduction glue into the lamp cap 16. The power component is entirely covered with the heat conduction glue to increase the heat dissipation area, thereby greatly improving the heat dissipation effect of the LED light bulb.

Figure 7C:
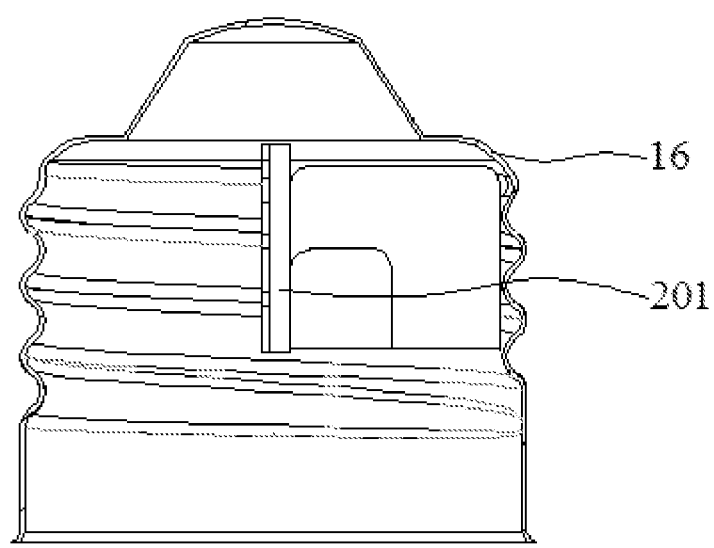
FIG. 7C is a schematic diagram of an embodiment of a cross section B-B in FIG. 7A.

In another embodiment, as shown in FIG. 7C, the substrate 201 is parallel to the axial direction of the lamp cap 16 or the axial direction of the stem 19 in FIG. 4, FIG. 5, and FIG. 8, since all the heating elements can be placed on the side of the substrate 201 close to the lamp cap 16, the heat generated by the heating elements can be quickly transferred to the lamp cap 16, thereby improving the heat dissipation efficiency of the power component; in addition, heating elements and non-heat-resistant elements can be separately arranged on the different surfaces of the substrate 201, it can reduce the influence of the heat generated by the heating element on the heat-resistant element, and improve the overall reliability and life of the power component. In one embodiment a heating element (an element that generates more heat during operation, such as an IC or a resistor) and a non-heat-resistant element (such as an electrolytic capacitor) are disposed on the substrate 201. The heating element is closer to the inner surface of the lamp cap 16 than other electronic elements (such as non-heat-resistant elements or other non-heat sensitive elements, for example, a capacitor). Therefore, compared with other electronic elements, the heating element has a shorter heat transfer distance from the lamp cap 16, which is more conducive to the heat generated by the heating element during operation being conducted to the lamp cap 16 for heat dissipation, thereby improving the heat dissipation efficiency of the power component 20.

As shown in FIG. 5 to FIG. 7, the projections of the inflation pipe and the substrate 201 on the XY-plane overlap. In some embodiments, the projections of the inflation pipe and the substrate 201 on the XZ-plane and/or YZ-plane are separated (or do not overlap), or in the height direction of the lamp cap 16 (or Z-axis direction), there is a certain distance between the inflation pipe and the substrate 201, so the inflation pipe and the substrate 201 are not in contact with each other, and thereby increasing the accommodation space of the power component and improving the utilization rate of the substrate 201. In addition, when the substrate 201 is in contact with the inner surface of the lamp cap 16, a cavity is formed between the first surface 2011 of the substrate 201 and the stem 19, and the heat generated by the heating element located on the first surface of the substrate 201 may be transferred through the cavity, which reduces the thermal impact on the non-heat-resistant element located on the second surface, thereby increasing the service life of the power component.

Figure 8A:
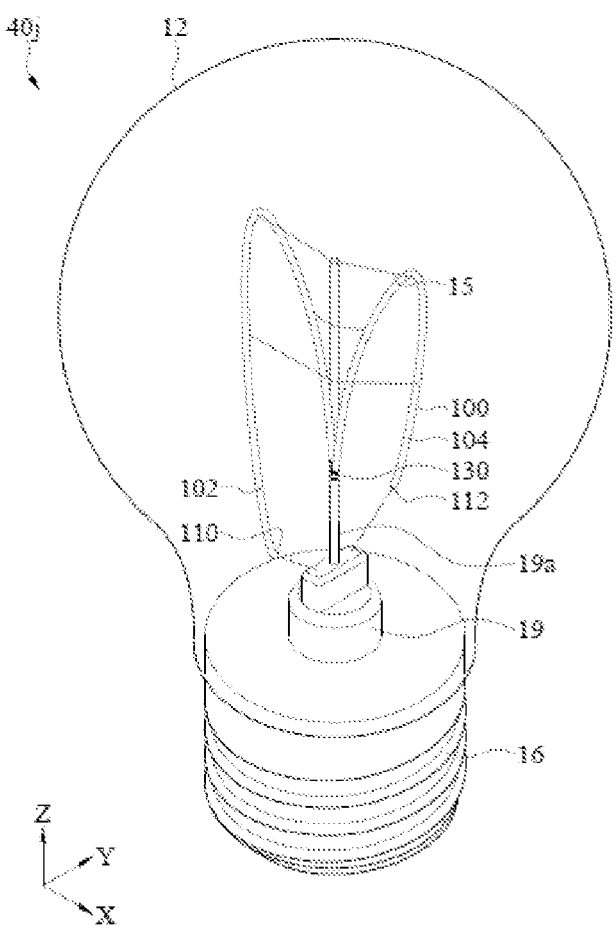
FIG. 8A to FIG. 8D are respectively a schematic diagram, a side view, another side view, and a top view of an LED light bulb according to an embodiment of this application.
Figure 8B:
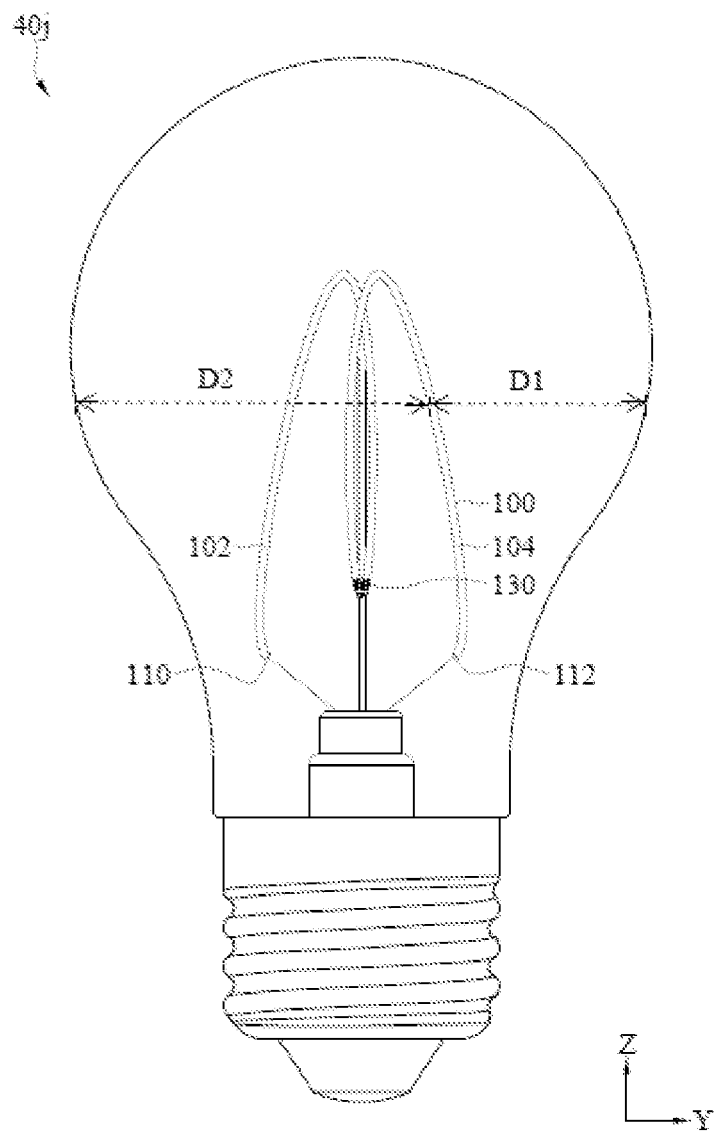
Figure 8C:
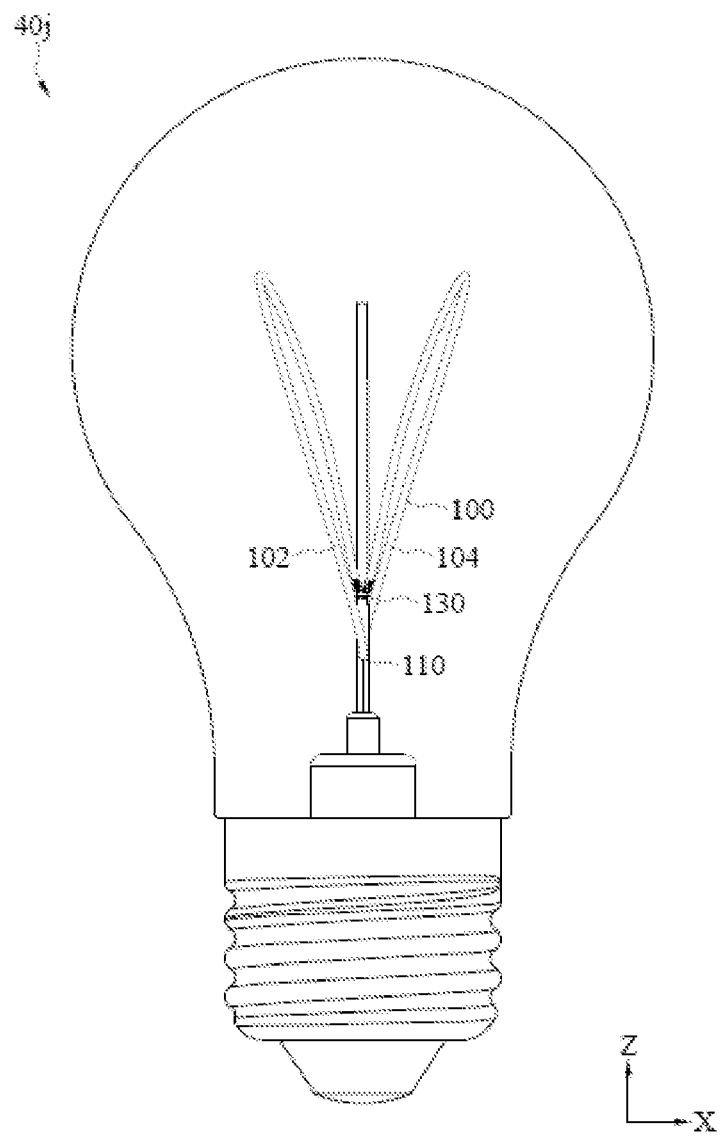
Figure 8D:
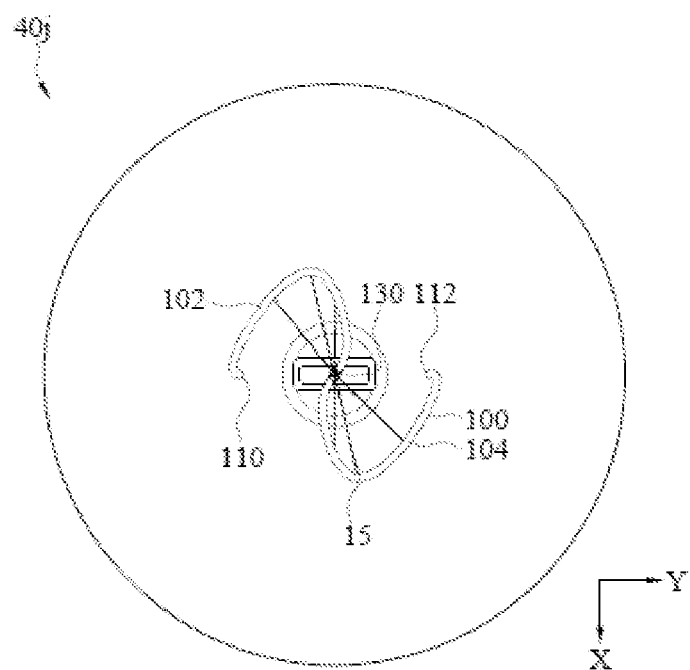

Referring to FIG. 8A to FIG. 8D, FIG. 8A to FIG. 8D are schematic diagrams of an LED light bulb 40j according to an embodiment of this application. The LED light bulb 40j in this embodiment has the same basic structure as the LED light bulb 40h in FIG. 4, including a lamp housing 12, a lamp cap 16 connected to the lamp housing 12, at least two conductive brackets disposed in the lamp housing 12, at least one supporting arm 15, a stem 19, and an LED filament 100, and the supporting arms 15 are not shown in FIG. 8B and FIG. 8C. The stem 19 includes the stand 19a. Each supporting arm 15 includes a first end and a second end that are opposite to each other. The first end of each supporting arm 15 is connected to the stand 19a, and the second end of each supporting arm 15 is connected to the LED filament 100. The LED light bulb shown in FIG. 8C is different from the light bulb shown in FIG. 4 in that the height of the stand 19a is greater than the distance between a bottom portion of the stand 19a and the conductive section 130 in the Z-axis direction, and the stand 19a comprises the bottom portion of the stand 19a and the top portion of the stand 19a opposite to each other, where the bottom portion of the stand 19a is closer to the inflation pipe. As shown in FIG. 8D, in the XY-plane, the central angle corresponding to the arc where at least two bending points of the LED filament 100 are located ranges from 170° to 220°, so that there is a proper distance between bending points of the LED section 102, 104 to ensure the heat dissipation effect of the LED filament 100. At least one supporting arm 15 is located at the bending point of the LED filament 100, for example, at the bending point of the LED section 102/104. Each supporting arm 15 has an intersection with the LED filament 100. On the XY-plane, at least two intersections are located on a circumference of a circle taking the stem 19 (or the stand 19a) as a center, the LED filament has certain symmetry, and the luminous flux in all directions is roughly the same, so that the Light bulb can emit light evenly. In one embodiment, at least one intersection and the bending point of the conductive section 130 form a straight line La, and the intersection on the straight line La and the electrode 110/112 of the LED filament form a straight line Lb. The range of the angle α between the straight line La and the straight line Lb is 0°<α<90°, preferably 0°<α<60°, so that the LED sections have a proper spacing after bending, and have good light emission and heat dissipation effects. The LED section has a curvature radius at the bending point. For example, the LED section 102 has a curvature radius r3 at the bending point, the LED section 104 has a curvature radius r4 at the bending point, r3 is equal to r4, and the light is uniform on each plane. Certainly, it is also possible to set r3 to be greater than r4 or r3 to be less than r4 to meet lighting requirements and/or heat dissipation requirements in some specific directions. The conductive section 130 has a curvature radius r5 at the bending point, r5 is less than a maximum value of r3 and r4, that is, r5<max (r3, r4), so that the LED filament 100 is not easy to break, and there is a certain distance between the LED sections 102, 104 that are closer to the stem to prevent the heat generated by the two LED sections 102, 104 from affecting each other.

In one embodiment, the LED section 102/104 includes a first section and a second section. The first section is extending upward (the direction of the top portion of the lamp housing 12) from the electrode 110/112 to the bending point, and the second section is extending downward (the direction of the lamp cap 16) from the bending point to the conductive section 130 connecting two LED sections 102, 104. The first section and the second section to the lamp housing 12 respectively have a first distance and a second distance that are opposite to each other, and the first distance is less than the second distance. In the first distance direction, the base layer of the LED filament 100 is close to the lamp housing 12, and the top layer of the LED filament 100 is away from the lamp housing 12. For example, in FIG. 8B, the first section of the LED section 104 to the lamp housing 12 has a first distance D1 and a second distance D2, and the first distance D1 is less than the second distance D2. In the first distance D1 direction, the base layer of the LED filament 100 is close to the lamp housing 12, and the top layer of the LED filament 100 is away from the lamp housing 12. When the LED filament 100 is bent, the conductive wire in the LED filament 100 has a small bending stress and is not easy to break, improving the production quality of the LED light bulb 40j.

Referring to FIG. 4A to FIG. 4D and FIG. 8A to FIG. 8D, a plane A divides the lamp housing 12 into an upper portion and a lower portion, and the lamp housing 12 has the largest width at the plane A. For example, a plane figure formed by R2 (maximum horizontal spacing) in FIG. 4B is located on the plane A, and when there is an intersection between the stem 19 and the plane A, the lamp housing 12 has a lamp housing top portion and a lamp housing bottom portion that are opposite to each other, the lamp housing bottom portion is close to the lamp cap 12, and the length of the LED filament located between the lamp housing top portion and the plane A (or in the height direction of the LED light bulb, the distance from the highest point of the LED filament to the plane A) is less than the length of the LED filament located between the plane A and the lamp housing bottom portion (or in the height direction of the LED light bulb, the distance from the lowest point of the LED filament to the plane A). Because when there is an intersection between the stem 19 and the plane A, the inner diameter of the lamp housing 12 above the top portion of the stem 19 is small and the volume for accommodating gas is small, if a large part of the LED filament is located on the top portion of the stem 19, the overall heat dissipation effect of the LED filament is affected, thereby reducing the product quality. When there is a distance between the stem 19 and the plane A, and the distance from a stem top portion to the plane A is less than the height of the stand 19a, the stem 19 includes a stem bottom portion and a stem top portion opposite to each other, the stem bottom portion is connected to the lamp cap 16, the stem top portion extends to the direction of the lamp housing top portion, and the length of the LED filament located between the stem top portion and the lamp housing top portion (or the distance between the highest point of the LED filament and the stem top portion) is less than the length of the LED filament located between the stem top portion and the lamp housing bottom portion (or the distance between the stem top portion and the lowest point of the LED filament). Most of the LED filament can be indirectly supported by the stem 19, so as to ensure the stability of the LED filament shape during the transportation of the LED light bulb. In some embodiments, when there is a distance between the stem 19 and the plane A, and the distance from the stem top portion to the plane A is greater than the height of the stand 19a, the stem 19 includes a stem bottom portion and a stem top portion opposite to each other, the stem bottom portion is connected to the lamp cap 12, the stem top portion extends to the direction of the lamp housing top portion, and the length of the LED filament located between the stem top portion and the lamp housing top portion is greater than the length of the LED filament located between the stem top portion and the lamp housing bottom portion. Since the volume of gas contained between the stem top portion and the lamp housing bottom portion is large, and most of the LED filament is located between the stem top portion and the lamp housing bottom portion, which facilitates the heat dissipation of the LED filament.

Figure 9:
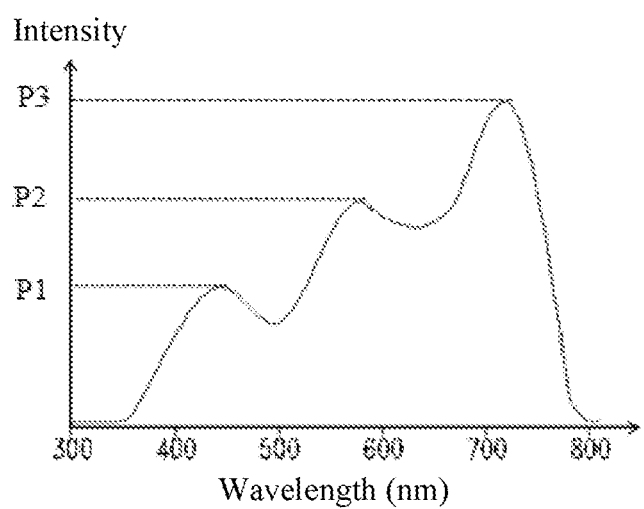
FIG. 9 is a schematic diagram of a light emission spectrum of an LED light bulb according to an embodiment of this application.
Figure 10:
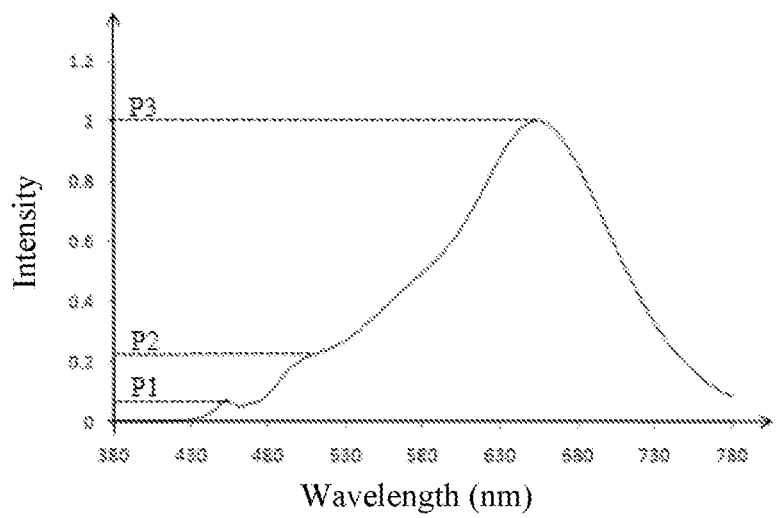
FIG. 10 is a schematic diagram of a light emission spectrum of an LED light bulb according to an embodiment of this application.

Referring to FIG. 9, FIG. 9 is a schematic diagram of a light emission spectrum of an LED light bulb according to an embodiment of this application. In this embodiment, the LED light bulb may be any LED light bulb disclosed in the previous embodiments, and any single LED filament disclosed in the previous embodiments is disposed in the LED light bulb. The light emitted by the LED light bulb is measured by a spectrometer to obtain a schematic diagram of a spectrum shown in FIG. 9. It can be seen from the schematic diagram of the spectrum that the spectrum of the LED light bulb is mainly distributed between the wavelengths from 400 nm to 800 nm, and three peaks P1, P2, P3 appear at three places in this range. The peak P1 is approximately between the wavelengths from 430 nm to 480 nm. The peak P2 is approximately between the wavelengths from 580 nm to 620 nm. The peak P3 is approximately between the wavelengths from 680 nm to 750 nm. With regard to intensity, the intensity of the peak P1 is less than the intensity of the peak P2, and the intensity of the peak P2 is less than the intensity of the peak P3. As shown in FIG. 9, such a spectral distribution is close to the spectral distribution of a conventional incandescent filament lamp and also close to the spectral distribution of natural light. In one embodiment, a schematic diagram of a light emission spectrum of a single LED filament is shown in FIG. 10. It can be seen from the schematic diagram of the spectrum that the spectrum of the LED light bulb is mainly distributed between the wavelengths from 400 nm to 800 nm, and there are three peaks P1, P2, and P3 appear in this range. The peak P1 is approximately between the wavelengths from 430 nm to 480 nm. The peak P2 is approximately between the wavelengths from 480 nm to 530 nm. The peak P3 is approximately between the wavelengths from 630 nm to 680 nm. With regard to intensity, the intensity of the peak P1 is less than the intensity of the peak P2, and the intensity of the peak P2 is less than the intensity of the peak P3. Such a spectral distribution is close to the spectral distribution of a conventional incandescent filament lamp and also close to the spectral distribution of natural light.

Figure 11:
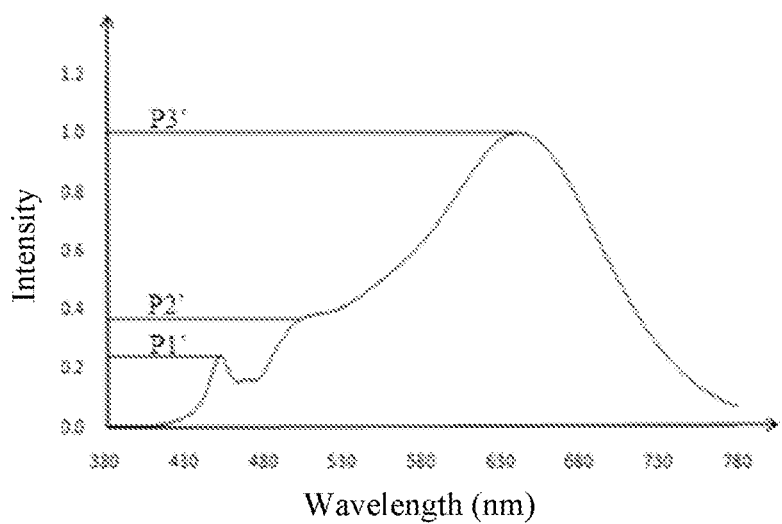
FIG. 11 is a schematic diagram of a light emission spectrum of an LED light bulb according to an embodiment of this application.

Referring to FIG. 11, FIG. 11 is a light emission spectrum of an LED light bulb according to one embodiment of this application. It can be seen from the figure that there are three peaks P1', P2', and P3' similar to those shown in FIG. 10 between the wavelengths from 400 nm to 800 nm where the spectrum of the LED light bulb is distributed. The peak P1' is approximately between the wavelengths from 430 nm to 480 nm. The peak P2' is approximately between the wavelengths from 480 nm to 530 nm. The peak P3' is approximately between the wavelengths from 630 nm to 680 nm. With regard to intensity, the intensity of the peak P1' is less than the intensity of the peak P2', and the intensity of the peak P2' is less than the intensity of the peak P3'. The difference is that the intensity of P1' is greater than that of P1, and the FWHM of P3' is greater than that of P3. The LED light bulb has an average color rendering index Ra (R1-R8) greater than 95, saturated red color (R9) greater than or equal to 90, and a luminous efficiency (Eff) of the LED filament greater than or equal to 100.

The "one LED filament" or "an LED filament" in this application is formed by connecting the above-mentioned conductive section and the LED section or is only formed by the LED sections (or LED chip units), which has the same and continuous light conversion layer (including the same and continuously formed top layer or bottom layer), and only provides two conductive electrodes electrically connected to the conductive brackets of the light bulb at two ends. The structure that meets the above-mentioned structure description is the single LED filament structure in this application.

This application has been disclosed above with preferred embodiments. However, those skilled in the art should understand that these embodiments are only used to describe some implementations in this application, and should not be construed as a limitation. It should be noted that all changes and substitutions equivalent to these embodiments or proper combinations between these embodiments (especially the filament embodiment is combined into the light bulb embodiment in FIG. 4) should fall within the scope supported by the specification of this application. Therefore, the protection scope of this application shall be subject to the appended claims.

What is claimed is:

1. An LED filament, comprising:
   at least one LED section, each LED section comprising at least two LED chips electrically connected to each other;
   electrodes, electrically connected to the LED section; and
   a light conversion layer, wrapping the LED section and parts of the electrodes, and comprising a top layer and a carrying layer, the carrying layer comprising a base layer and a transparent layer, the base layer comprising an upper surface and a lower surface opposite to each other, wherein the upper surface of the base layer being in contact with a part of the top layer, and a part of the lower surface of the base layer being in contact with the transparent layer, and the light conversion layer has a first end and a second end opposite to the first end, and the LED chips are located between the first end and the second end.

2. The LED filament according to claim 1, wherein a total length of the transparent layer is 10-80% of the total length of the base layer.

3. The LED filament according to claim 1, wherein the transparent layer comprises a first transparent layer and a second transparent layer, the first transparent layer extends from one end of the base layer, and the second transparent layer extends from the other end of the base layer.

4. The LED filament according to claim 3, wherein a gap is formed between the first transparent layer and the second transparent layer, and in a length direction of the LED filament, a distance between the first transparent layer and the second transparent layer is greater than a length of the first transparent layer or the second transparent layer.

5. The LED filament according to claim 4, wherein the LED chip closest to the first end is denoted as LED chip $n_1$, then LED chips from the first end to the second end are sequentially LED chip $n_2$, LED chip $n_3$, ..., and LED chip $n_m$, m being an integer and m≤800, and in the length direction of the LED filament, the length of the first transparent layer or the second transparent layer is at least greater than the distance from the first end to the LED chip $n_2$.

6. The LED filament according to claim 1, wherein there are at least two LED chips every millimeter of a filament length on average, and a temperature of the LED filament is not greater than a junction temperature when the LED filament is lit for 15,000 h in a surrounding environment at 25° C.

7. The LED filament according to claim 1, further comprising conductive sections connecting adjacent LED sections, a shortest distance between two LED chips respectively located in two adjacent LED sections being greater than a distance between two adjacent LED chips in the LED section.

8. An LED light bulb, comprising:
   a lamp housing;
   a lamp cap, connected to the lamp housing;
   a stem, comprising a stand located in the lamp housing;
   an LED filament, located in the lamp housing, the LED filament comprising:
   at least one LED section, each LED section comprising at least two LED chips, adjacent LED chips being electrically connected to each other;
   electrodes, electrically connected to the LED section; and
   a light conversion layer, wrapping the LED section and parts of the electrodes, and comprising a top layer and a carrying layer, the carrying layer comprising a base layer and a transparent layer, the base layer comprising an upper surface and a lower surface opposite to each other, the upper surface of the base layer being in contact with a part of the top layer, and a part of the lower surface of the base layer being in contact with the transparent layer; and
   at least one supporting arm, each supporting arm comprising a first end and a second end that are opposite to each other, the first end of each supporting arm being connected to the stand, and the second end of each supporting arm being connected to the LED filament.

9. The LED light bulb according to claim 8, wherein a plane A divides the lamp housing into an upper portion and a lower portion, and the lamp housing has a largest width at the plane A, when there is an intersection between the stem and the plane A, the lamp housing has a lamp housing top portion and a lamp housing bottom portion that are opposite to each other, the lamp housing bottom portion is close to the lamp cap, and a length of the LED filament located between the lamp housing top portion and the plane A is less than a length of the LED filament located between the plane A and the lamp housing bottom portion.

10. The LED light bulb according to claim 8, wherein a plane A divides the lamp housing into an upper portion and a lower portion, and the lamp housing has a largest width at the plane A, when there is an intersection between the stem and the plane A, the lamp housing has a lamp housing top portion and a lamp housing bottom portion that are opposite to each other, the lamp housing bottom portion is close to the lamp cap, and in a height direction of the LED light bulb, a distance from a highest point of the LED filament to the plane A is less than a distance from a lowest point of the LED filament to the plane A.

11. The LED light bulb according to claim 8, wherein a plane A divides the lamp housing into an upper portion and a lower portion, and the lamp housing has a largest width at the plane A, when there is a distance between the stem and the plane A, and the distance from a stem top portion to the plane A is less than a height of the stand, the stem comprises a stem bottom portion and a stem top portion opposite to each other, the stem bottom portion is connected to the lamp cap, the stem top portion extends to the direction of the lamp housing upper portion, and a length of the LED filament located between the stem top portion and the lamp housing top portion is less than a length of the LED filament located between the stem top portion and the lamp housing lower portion.

12. The LED light bulb according to claim 8, wherein a plane A divides the lamp housing into an upper portion and a lower portion, and the lamp housing has a largest width at the plane A, when there is a distance between the stem and the plane A, and the distance from a stem top portion to the plane A is less than a height of the stand, the stem comprises a stem bottom portion and a stem top portion, the stem bottom portion is connected to the lamp cap, the stem top portion extends to a direction of the lamp housing upper portion, and a distance between a highest point of the LED filament and the stem top portion is less than a distance between the stem top portion and a lowest point of the LED filament.

13. The LED light bulb according to claim 8, wherein the LED section comprises a first section and a second section, the first section and the second section respectively have a first distance and a second distance to the lamp housing that are opposite to each other, and the first distance is less than the second distance.

14. The LED light bulb according to claim 13, wherein in a first distance direction, the base layer of the LED filament is close to the lamp housing, and the top layer of the LED filament is away from the lamp housing.

15. The LED light bulb according to claim 8, a Cartesian coordinate system having an X-axis, a Y-axis and a Z-axis being oriented for the LED light bulb, wherein the Z-axis is parallel to the stem, each supporting arm has an intersection with the LED filament, and on the XY-plane, at least two intersections are located on a circumference of a circle taking the stem as a center.

16. The LED light bulb according to claim 15, wherein the LED filament further comprises conductive sections connecting adjacent LED sections, at least one intersection and a bending point of a conductive section 130 form a straight line La, the intersection on the straight line La and the electrode of the filament form a straight line Lb, and a range of an angle α between the straight line La and the straight line Lb is $0°<α<90°$.

17. The LED light bulb according to claim 8, wherein a spectral intensity of the light emitted by the LED filament has three peaks P1', P2', and P3' between wavelengths of 400 nm to 800 nm, the peak P1' is between the wavelengths from 430 nm to 480 nm, the peak P2' is between the wavelengths from 480 nm to 530 nm, and the peak P3' is between the wavelengths from 630 nm to 680 nm.

18. The LED light bulb according to claim 8, wherein an average color rendering index of the LED light bulb is greater than 95, and a luminous efficiency of the LED filament is greater than or equal to 100 lm/W.

19. The LED light bulb according to claim 8, wherein there are at least two LED chips every millimeter of a top layer length on average, and a temperature of the LED filament is not greater than a junction temperature when the LED filament is lit for 15,000 hours in a surrounding environment at 25° C.

\* \* \* \* \*